US011928003B2

(12) United States Patent
Naito

(10) Patent No.: US 11,928,003 B2
(45) Date of Patent: Mar. 12, 2024

(54) VOLTAGE CONTROL DEVICE

(71) Applicant: SONY SEMICONDUCTOR SOLUTIONS CORPORATION, Kanagawa (JP)

(72) Inventor: Takahiro Naito, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/755,838

(22) PCT Filed: Sep. 30, 2020

(86) PCT No.: PCT/JP2020/037169
§ 371 (c)(1),
(2) Date: May 10, 2022

(87) PCT Pub. No.: WO2021/100329
PCT Pub. Date: May 27, 2021

(65) Prior Publication Data
US 2022/0404895 A1     Dec. 22, 2022

(30) Foreign Application Priority Data

Nov. 19, 2019  (JP) ................................ 2019-208780

(51) Int. Cl.
G06F 1/3296     (2019.01)
G06F 1/06       (2006.01)
G06F 1/3206     (2019.01)

(52) U.S. Cl.
CPC .............. *G06F 1/3296* (2013.01); *G06F 1/06* (2013.01); *G06F 1/3206* (2013.01)

(58) Field of Classification Search
CPC . G06F 1/26; G06F 1/3296; G06F 1/06; G06F 1/08
See application file for complete search history.

(56) References Cited

U.S. PATENT DOCUMENTS

| 6,944,780 B1 | 9/2005 | Kranzen et al. |
| 7,519,925 B2 * | 4/2009 | Issa .......................... G06F 30/36 327/237 |

(Continued)

FOREIGN PATENT DOCUMENTS

| AU | 2003209296 A1 | 9/2003 |
| CN | 1643480 A | 7/2005 |

(Continued)

OTHER PUBLICATIONS

Bol, et al., "A 25MHz 7μW/MHz ultra-low-voltage microcontroller SoC in 65nm LP/GP CMOS for low-carbon wireless sensor nodes", IEEE, International Solid-State Circuits Conference, Feb. 19-23, 2012.

(Continued)

*Primary Examiner* — Vincent H Tran
(74) *Attorney, Agent, or Firm* — CHIP LAW GROUP

(57) ABSTRACT

To provide a voltage control device that includes a power supply circuit that supplies electric power to an input terminal of a controlled circuit, a power supply voltage control circuit that controls the power supply voltage to be supplied from the power supply circuit to the controlled circuit, on the basis of the clock signal to be supplied to the controlled circuit, and a clock generation circuit that receives a power supply that is the internal voltage to be applied to a second internal circuit region at a second wiring distance from the input terminal, and generates the clock signal on the basis of the internal voltage, the second wiring distance being longer than a first wiring distance at which a first internal circuit region is located in the controlled circuit, the first wiring distance and the second wiring distance being wiring distances in the controlled circuit from the input terminal.

15 Claims, 16 Drawing Sheets

(56) References Cited

U.S. PATENT DOCUMENTS

| | | | |
|---|---|---|---|
| 9,766,649 B2* | 9/2017 | Felix | G06F 1/08 |
| 2006/0091385 A1* | 5/2006 | Mair | H03F 1/0211 |
| | | | 257/49 |
| 2006/0181939 A1* | 8/2006 | Fuhrmann | G11C 29/023 |
| | | | 365/189.11 |
| 2007/0096775 A1 | 5/2007 | Elgebaly et al. | |
| 2011/0309888 A1* | 12/2011 | Bulzacchelli | H03L 7/0995 |
| | | | 331/109 |
| 2013/0145190 A1 | 6/2013 | Sakugawa et al. | |
| 2014/0025981 A1* | 1/2014 | Evans | G06F 1/10 |
| | | | 713/501 |
| 2014/0289690 A1* | 9/2014 | Chopra | G06F 30/394 |
| | | | 716/113 |
| 2015/0220130 A1 | 8/2015 | Sakugawa et al. | |
| 2016/0179186 A1* | 6/2016 | Toh | G06F 1/3206 |
| | | | 713/322 |
| 2016/0334832 A1* | 11/2016 | Epstein | G06F 1/08 |
| 2017/0005665 A1* | 1/2017 | Swaminathan | H03L 7/099 |
| 2017/0075402 A1* | 3/2017 | Pant | G06F 1/04 |
| 2019/0094897 A1* | 3/2019 | Vangal | G05F 1/66 |

FOREIGN PATENT DOCUMENTS

| | | | | |
|---|---|---|---|---|
| CN | 101689071 A | | 3/2010 | |
| CN | 103069409 A | | 4/2013 | |
| EP | 1964258 A2 | | 9/2008 | |
| JP | 2006-502466 A | | 1/2006 | |
| JP | 2009-519620 A | | 5/2009 | |
| JP | 2010-040053 A | | 2/2010 | |
| JP | 2013-211022 A | | 10/2013 | |
| JP | 2018101222 A | * | 6/2018 | ............. H03K 5/135 |
| KR | 10-2008-0091092 A | | 10/2008 | |
| WO | 2003/062972 A2 | | 7/2003 | |
| WO | 2007/053839 A2 | | 5/2007 | |
| WO | 2012/026024 A1 | | 3/2012 | |

OTHER PUBLICATIONS

International Search Report and Written Opinion of PCT Application No. PCT/JP2020/037169, dated Jan. 12, 2021, 08 pages of ISRWO.

* cited by examiner

30

VOLTAGE CONTROL DEVICE

CROSS REFERENCE TO RELATED APPLICATIONS

This application is a U.S. National Phase of International Patent Application No. PCT/JP2020/037169 filed on Sep. 30, 2020, which claims priority benefit of Japanese Patent Application No. JP 2019-208780 filed in the Japan Patent Office on Nov. 19, 2019. Each of the above-referenced applications is hereby incorporated herein by reference in its entirety.

TECHNICAL FIELD

The present disclosure relates to a voltage control device.

BACKGROUND ART

A portable electronic device or a small-sized electronic device such as the Internet of Things (IoT) is expected to be driven as long as possible, though small in size. Therefore, there is a strong demand for lowering of power consumption by the system in the device. A controlled circuit in the device can reduce power consumption by lowering the power supply voltage. On the other hand, to guarantee the operation of the controlled circuit, the power supply voltage to be applied to the controlled circuit must be equal to or higher than the lowest operating voltage. Therefore, there is a demand to lower power consumption by bringing the power supply voltage as close to the lowest operating voltage as possible while maintaining the power supply voltage equal to or higher than the lowest operating voltage.

CITATION LIST

Non-Patent Document

Non-Patent Document 1: David Bol et al., "A 25 MHz 7 μW/MHz Ultra-Low-Voltage Microcontroller SoC in 65 nm LP/GP CMOS for Low-Carbon Wireless Sensor Nodes", ISSCC 2012.

SUMMARY OF THE INVENTION

Problems to be Solved by the Invention

To meet such a demand, an adaptive voltage scaling (AVS) control device may be used. An AVS control device is a voltage control device that controls a controlled circuit to reduce power consumption, while adapting the power supply voltage of the controlled circuit to the operating environments such as production tolerance, temperature, and operating frequency. The AVS control device needs to perform AVS control by adding the largest predicted value of a voltage drop due to production tolerance or the like, as a voltage margin to the lowest operating voltage. In a conventional AVS control device, however, it is necessary to set a large voltage margin, taking into consideration correlation errors between the controlled circuit and the AVS control device. Therefore, there is the problem of an unnecessary power loss.

In view of the above, the present disclosure provides a voltage control device that is capable of lowering power consumption by bringing the power supply voltage of a controlled circuit as close to the lowest operating voltage as possible while maintaining the power supply voltage equal to or higher than the lowest operating voltage.

Solutions to Problems

A voltage control device according to one aspect of the present disclosure includes: a power supply circuit that supplies electric power to an input terminal of a controlled circuit; a power supply voltage control circuit that controls the power supply voltage to be supplied from the power supply circuit to the controlled circuit, on the basis of the clock signal to be supplied to the controlled circuit; and a clock generation circuit that receives a power supply that is the internal voltage to be applied to a second internal circuit region at a second wiring distance from the input unit, and generates the clock signal on the basis of the internal voltage, the second wiring distance being longer than a first wiring distance at which a first internal circuit region is located in the controlled circuit, the first wiring distance and the second wiring distance being wiring distances in the controlled circuit from the input unit.

The second wiring distance is longer than half the longest distance among a plurality of wiring distances from the input unit to a plurality of internal circuit regions in the controlled circuit.

The second wiring distance is substantially the longest among a plurality of wiring distances from the input unit to a plurality of internal circuit regions in the controlled circuit.

The internal voltage is lower than the voltage to be applied to the first internal circuit region.

The internal voltage has a voltage drop that is larger than half the largest voltage drop from the power supply voltage in the controlled circuit.

The internal voltage is substantially the lowest voltage among the voltages to be supplied to a plurality of internal circuit regions in the controlled circuit.

The linear distance from the input unit to the second internal circuit region is longer than the linear distance from the input unit to the first internal circuit region.

The linear distance from the input unit to the second internal circuit region is longer than half the longest distance among a plurality of linear distances from the input unit to a plurality of internal circuit regions in the controlled circuit.

The linear distance from the input unit to the second internal circuit region is substantially the longest among a plurality of linear distances from the input unit to a plurality of internal circuit regions in the controlled circuit.

The clock generation circuit has the same circuit configuration as the second internal circuit region.

The clock generation circuit includes a delay circuit that inverts an input signal, outputs the inverted input signal as an output signal, and receives an input of the output signal as the input signal.

The voltage control device further includes
  a selection circuit that receives an input of a plurality of internal voltages to be applied to a plurality of internal circuit regions in the controlled circuit, and selects the lowest internal voltage from the plurality of internal voltages, and
  the clock generation circuit receives the lowest internal voltage as the power supply, and generates the clock signal on the basis of the lowest internal voltage.

The voltage control device further includes
  a storage unit that stores information about the second internal circuit region that receives the lowest internal voltage, and the selection circuit selects the second internal circuit region on the basis of the information obtained from the storage unit.

The voltage control device further includes:

a plurality of clock generation circuits that receives power supplies that are a plurality of internal voltages to be applied to a plurality of internal circuit regions in the controlled circuit, and generates a plurality of clock signals on the basis of the plurality of internal voltages; and a selection circuit that receives an input of a plurality of clock signals from the plurality of clock generation circuits, and selects a clock signal having the lowest frequency from the plurality of clock signals.

The voltage control device further includes a storage unit that stores information about the clock generation circuit that outputs the clock signal having the lowest frequency, and the selection circuit selects the clock signal on the basis of the information obtained from the storage unit.

MODE FOR CARRYING OUT THE INVENTION

Figure 1:
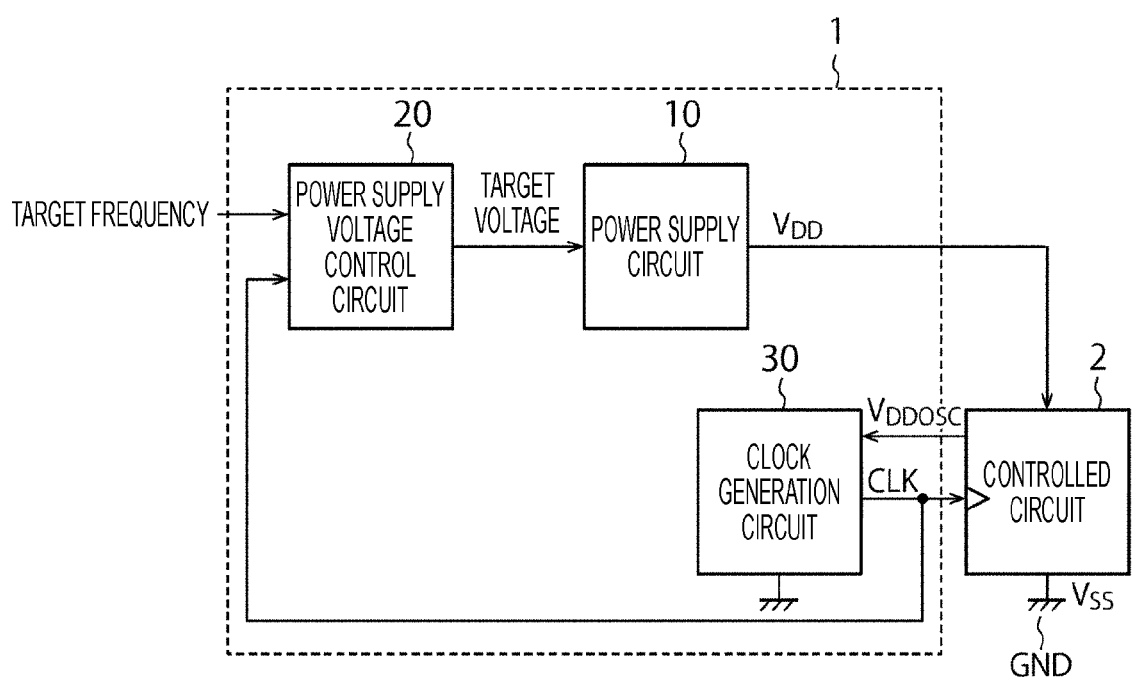
FIG. 1 is a block diagram showing an example configuration of a voltage control device according to a first embodiment.

The following is a detailed description of specific embodiments to which the present technology is applied, with reference to the drawings. The drawings are schematic or conceptual, and the proportions of the respective components and the like are not necessarily the same as the actual ones. In the specification and the drawings, elements similar to those described with reference to the already described drawings are denoted by the same reference numerals, and detailed explanation of them will not be repeated more than once.

First Embodiment

FIG. 1 is a block diagram showing an example configuration of a voltage control device according to a first embodiment. A voltage control device 1 according to the present disclosure includes a power supply circuit 10, a power supply voltage control circuit 20, and a clock generation circuit 30. The voltage control device 1 is an AVS control device that controls the power supply voltage VDD to be applied to a controlled circuit 2 so as to adapt to the operating environments such as production tolerance, temperature, and operating frequency of the controlled circuit 2, for example.

The power supply circuit 10 receives a target voltage from the power supply voltage control circuit 20, and supplies power depending on the target voltage to the input unit of the controlled circuit 2. The controlled circuit 2 is a digital logic circuit that operates on the basis of a clock signal CLK, such as a central processing unit (CPU), for example. The controlled circuit 2 may be one or more semiconductor chips, or may be a semiconductor integrated circuit that is a component in one semiconductor chip.

The power supply voltage control circuit 20 receives the clock signal CLK output from the clock generation circuit 30 and a target frequency from the outside, and, on the basis of the clock signal CLK, controls the power supply voltage $V_{DD}$ to be supplied from the power supply circuit 10 to the controlled circuit 2. For example, the power supply voltage control circuit 20 adjusts the target voltage so that the clock signal CLK becomes equal to the target frequency. The target voltage is information indicating the voltage value of the power to be actually supplied from the power supply circuit 10 to the controlled circuit 2.

The clock generation circuit 30 receives the internal voltage of the controlled circuit 2, and outputs the clock signal CLK, with the internal voltage being a power supply voltage $V_{DDOSC}$. The power supply voltage $V_{DDOSC}$ is an internal voltage that is obtained by causing the power supply voltage $V_{DD}$ to drop in an internal circuit region in the controlled circuit 2. The clock signal CLK is supplied to the controlled circuit 2 and the power supply voltage control circuit 20. The clock signal CLK is supplied to the controlled circuit 2, to control the operation speed of the controlled circuit 2. The operation speed of the controlled circuit 2 changes depending on the frequency of the clock signal CLK, and accordingly, the target voltage required for the controlled circuit 2 also changes. Therefore, the clock signal CLK is fed back to the power supply voltage control circuit 20, and is used for adjusting the target voltage. The power supply voltage control circuit 20 controls the target voltage so that the clock signal CLK becomes equal to a preset target frequency.

The voltage control device 1 may include one or a plurality of semiconductor chips including the power supply circuit 10, the power supply voltage control circuit 20, and the clock generation circuit 30. Also, the voltage control device 1 may be provided outside the controlled circuit 2, or may be incorporated into the controlled circuit 2. Note that, in the present disclosure, the voltage control device 1 is described as being externally attached to the controlled circuit 2.

Figure 2:
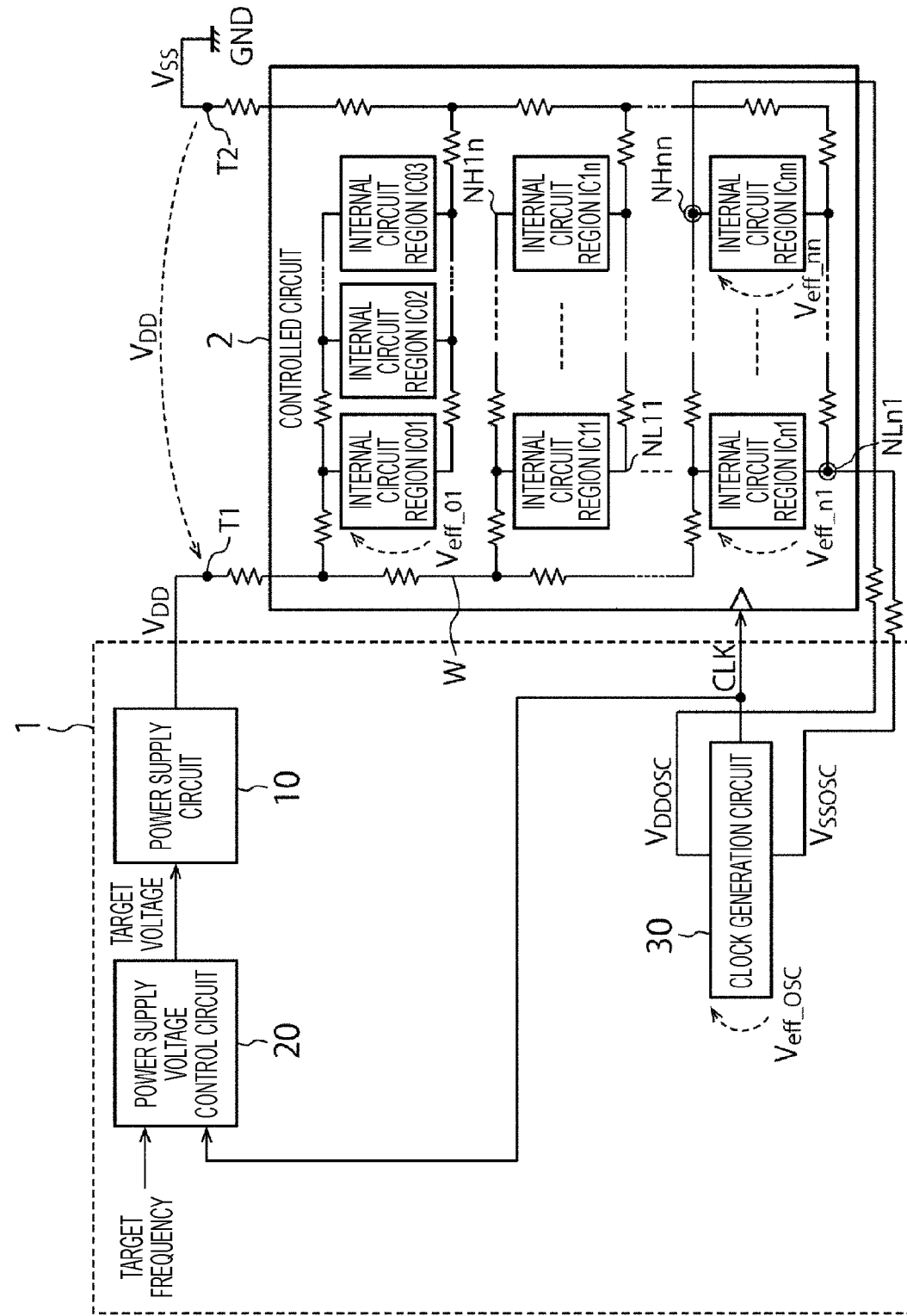
FIG. 2 is a block diagram showing an example connection relationship between the voltage control device and a controlled circuit.

FIG. 2 is a block diagram showing an example connection relationship between the voltage control device 1 and the controlled circuit 2. The controlled circuit 2 is a digital logic circuit, and includes a plurality of internal circuit regions IC01 to ICnn. Here, n is a positive integer. The internal circuit regions IC01 to ICnn may have the same circuit configurations, or may have different circuit configurations from one another. Further, the internal circuit regions IC01 to ICnn may be defined in any appropriate manner, and the digital logic circuit may be divided into any appropriate units.

The controlled circuit 2 is connected between the power supply circuit 10 and the ground GND. The power supply voltage $V_{DD}$ is applied to a high-voltage-side first terminal T1 as an input terminal, and a ground voltage $V_{SS}$ is applied to a low-voltage-side second terminal as another input terminal. Each of the internal circuit regions IC01 to ICnn is electrically connected between the first terminal T1 and the second terminal T2 via an internal wiring line W. The wiring distances from the first terminal T1 or the second terminal T2 to the internal circuit regions IC01 to ICnn may differ from one another among the respective internal circuit regions IC01 to ICnn. For example, in the present disclosure, the wiring distance from the first terminal T1 to the internal circuit regions IC01 to ICij ($0 \le i \le n$, $0 \le j \le n$) becomes longer as i and j become larger. The wiring distance from the second terminal T2 to the internal circuit regions IC01 to ICij becomes longer as i becomes larger, and becomes longer as j becomes smaller.

Since the internal wiring line W has resistors, the voltage drop from the power supply voltage $V_{DD}$ in the internal circuit regions IC01 to ICnn varies depending on the respective wiring distances from the first terminal T1 to the internal circuit regions IC01 to ICnn. The voltage rise from the ground voltage $V_{SS}$ to the internal circuit regions IC01 to ICnn also varies depending on the respective wiring distances from the second terminal T2 to the internal circuit regions IC01 to ICnn. Therefore, the internal voltages (effective power supply voltages) to be applied between the high-voltage terminals on the side of the power supply circuit 10 and the low-voltage terminals on the side of the ground GND in the internal circuit regions IC01 to ICnn differ from one another among the internal circuit regions IC01 to ICnn. Hereinafter, the power supply voltage to be applied to both ends of a circuit will be also referred to as an effective power supply voltage. When the effective power supply voltages of the internal circuit regions IC01 to ICnn differ from one another, the operating frequencies of the internal circuit regions IC01 to ICnn vary. Therefore, the power supply voltage control circuit 20 is required to set the target voltage of the power supply voltage $V_{DD}$ so that all the operating frequencies of the internal circuit regions IC01 to ICnn are equal to or higher than the target frequency.

To make the operating frequencies of all the internal circuit regions IC01 to ICnn equal to or higher than the target frequency, the operating frequency of the internal circuit region having the largest voltage drop from the power supply voltage $V_{DD}$ in the controlled circuit 2 needs to be equal to or higher than the target frequency. Hereinafter, the path extending through such an internal circuit region (the second internal circuit region) having the largest voltage drop will be referred to as the "critical path". For example, where the internal circuit regions IC01 to ICnn have the same circuit configurations, the critical path is the path extending through the internal circuit regions ICn1 to ICnn between a node NHnn and a node NLn1. The node NHnn is a node of the high-voltage terminal of the internal circuit region ICnn. The node NLn1 is a node of the low-voltage terminal of the internal circuit region ICn1.

Note that, in practice, there are cases where it is difficult to identify the internal circuit region having the lowest effective power supply voltage by voltage measurement. That is, there are cases where it is difficult to identify the critical path. In such a case, the internal circuit region having a substantially longest wiring distance among the wiring distances from the first terminal T1 or the second terminal T2 to the plurality of internal circuit regions IC01 to ICnn may be determined to be the critical path. Also, in the planar layout of the controlled circuit 2, the internal circuit region having a substantially longest linear distance among the linear distances from the first terminal T1 or the second terminal T2 to the plurality of internal circuit regions IC01 to ICnn may be determined to be the critical path. Further, the critical path may be selected from a plurality of internal circuit regions as in the second or third embodiment.

For example, in FIG. 2, the second wiring distance from the first terminal T1 to the node NHnn (internal circuit region ICnn) is longer than the first wiring distance from the first terminal T1 to another internal circuit region (the first internal circuit region). That is, the second wiring distance from the first terminal T1 to the node NHnn is the longest distance among the wiring distances from the first terminal T1 to the plurality of internal circuit regions IC01 to ICnn in the controlled circuit 2. Accordingly, among the internal circuit regions IC01 to ICnn, the node NHnn of the internal circuit region ICnn has the largest voltage drop from the power supply voltage $V_{DD}$.

Meanwhile, the fourth wiring distance from the second terminal T2 to the node NLn1 (the internal circuit region ICn1) is longer than the third wiring distance from the second terminal T2 to another internal circuit region. That is, the fourth wiring distance from the second terminal T2 to the node NLn1 is the longest distance among the wiring distances from the second terminal T2 to the plurality of internal circuit regions IC01 to ICnn in the controlled circuit 2. Accordingly, among the internal circuit regions IC01 to ICnn, the node NLn1 of the internal circuit region ICn1 has the largest voltage rise from the ground voltage $V_{SS}$. Thus, the effective power supply voltage applied between the node NHnn and the node NLn1 is the effective power supply voltage in the controlled circuit 2, and the path extending through the internal circuit regions ICn1 to ICnn between the node NHnn and the node NLn1 is the critical path.

When the power supply voltage control circuit 20 sets the target voltage such that the operating frequency of the critical path is equal to or higher than the target frequency, all the operating frequencies of the internal circuit regions IC01 to ICnn can be equal to or higher than the target frequency. Therefore, the clock generation circuit 30 includes a replica circuit having the same circuit configuration as the critical path serving as the second internal circuit region.

Figure 3:
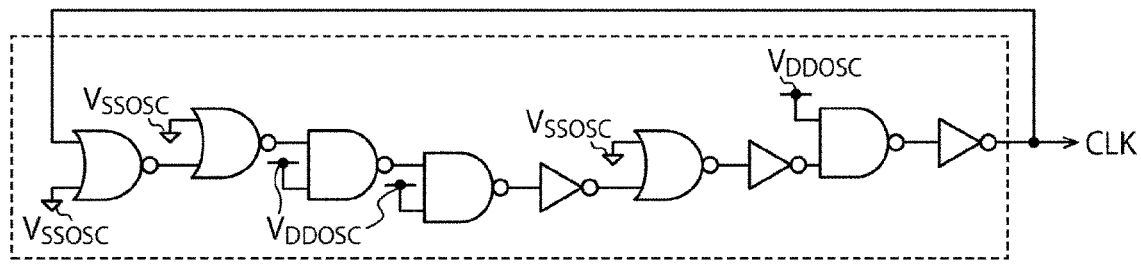
FIG. 3 is a circuit diagram showing an example internal configuration of a clock generation circuit.

FIG. 3 is a circuit diagram showing an example internal configuration of the clock generation circuit 30. The clock generation circuit 30 is a replica circuit of the critical path. That is, the clock generation circuit 30 is an example of a so-called critical path replica ring oscillator (CPRRO). The critical path is the internal circuit regions ICn1 to ICnn from the node NHnn to the node NLn1 in FIG. 2, for example. The clock generation circuit 30 having such a configuration is a delay circuit that outputs the clock signal CLK that is an output signal obtained by delaying and logically inverting an input signal, and receives a feedback input of the output signal as an input signal. By inverting and outputting its own output signal for each delay time, the clock generation circuit 30 can output the pulse-like clock signal CLK. Note that the clock generation circuit 30 may be a circuit having the same configuration as the critical path, but may be some other circuit having f-V characteristics substantially equal to those of the critical path.

Here, as shown in FIG. 3, the clock generation circuit 30 receives the voltage $V_{DDOSC}$ as the high-voltage-side power supply, and receives a voltage $V_{SSOSC}$ as the low-voltage-side power supply. Where the wiring resistances from the nodes NHnn and NLn1 to the clock generation circuit 30 are short enough, the voltage $V_{DDOSC}$ is substantially equal to the internal voltage of the node NHnn, and the voltage $V_{SSOSC}$ is substantially equal to the internal voltage of the node NLn1. With this arrangement, the clock generation circuit 30 has the same configuration as the internal circuit regions ICn1 to ICnn as the second internal circuit regions, and operates at an effective power supply voltage $V_{eff\_OSC}$ substantially equal to the internal voltage to be applied to the internal circuit regions ICn1 to ICnn. That is, the clock generation circuit 30 generates the clock signal CLK on the basis of the internal voltage of the node NHnn and the voltage difference (effective power supply voltage) $V_{eff\_OSC}$ of the node NLn1.

As the clock generation circuit 30 and the internal circuit regions ICn1 to ICnn have the same configurations, the clock generation circuit 30 can have the same characteristics (f-V characteristics, for example) as the internal circuit regions ICn1 to ICnn (which are the critical path). Further, the clock generation circuit 30 and the internal circuit regions ICn1 to ICnn operate at substantially the same power supply voltage. Therefore, the clock generation circuit 30 does not need to add a delay circuit (31 in FIG. 4, for example), taking into consideration the voltage drop in the effective power supply voltage for the internal circuit regions ICn1 to ICnn. Accordingly, this eliminates the need to consider a correlation error in the characteristics due to an additional delay circuit, and the need to add an unnecessary offset component to the characteristics of the clock generation circuit 30. With this arrangement, there is no need to include an unnecessary voltage margin in the target voltage, and the target voltage can be brought close to the lowest operating voltage, as described later. As a result, the voltage control device 1 according to the present disclosure can perform AVS control while lowering power consumption.

For example, in a case where a clock generation circuit operates at the power supply voltage $V_{DD}$ and the ground voltage $V_{SS}$, the clock generation circuit needs to additionally include a delay circuit, taking into consideration the voltage drop in the effective power supply voltage to be applied to the critical path.

Figure 4:
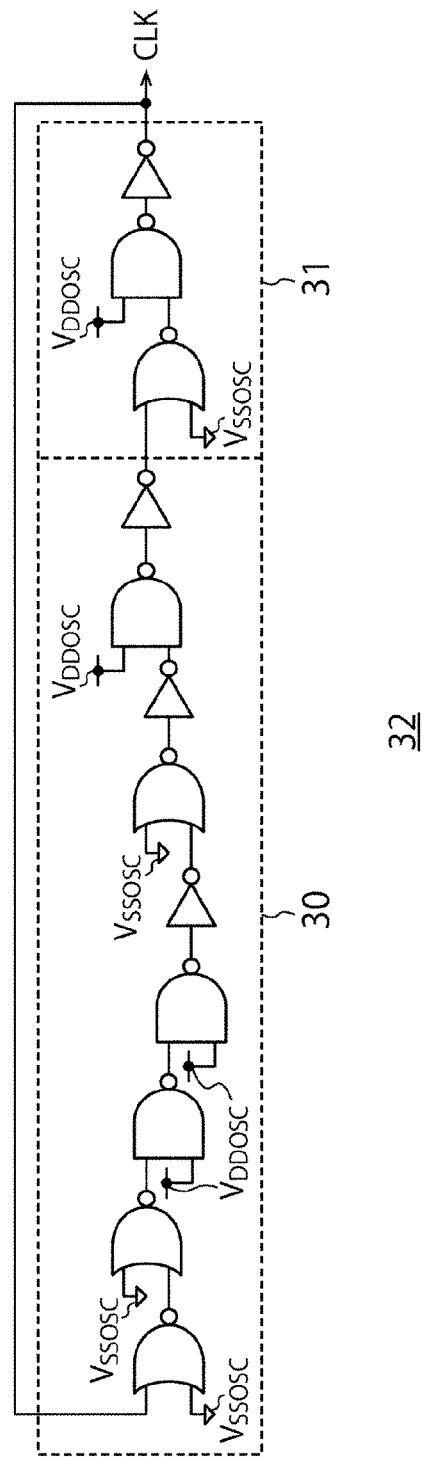
FIG. 4 is a circuit diagram showing a clock generation circuit in which a delay circuit is added to a replica circuit of internal circuit regions.

FIG. 4 is a circuit diagram showing a clock generation circuit 32 in which a delay circuit 31 is added to a replica circuit 30 of the internal circuit regions ICn1 to ICnn. As the power supply voltages $V_{DDOSC}$ and $V_{SSOSC}$ of the clock generation circuit 32, an external power supply voltage $V_{DD}$ and an external ground voltage $V_{SS}$ are used, respectively. The f-V characteristics of this clock generation circuit 32 are described below.

First, general f-V characteristics are described.

Figure 5:
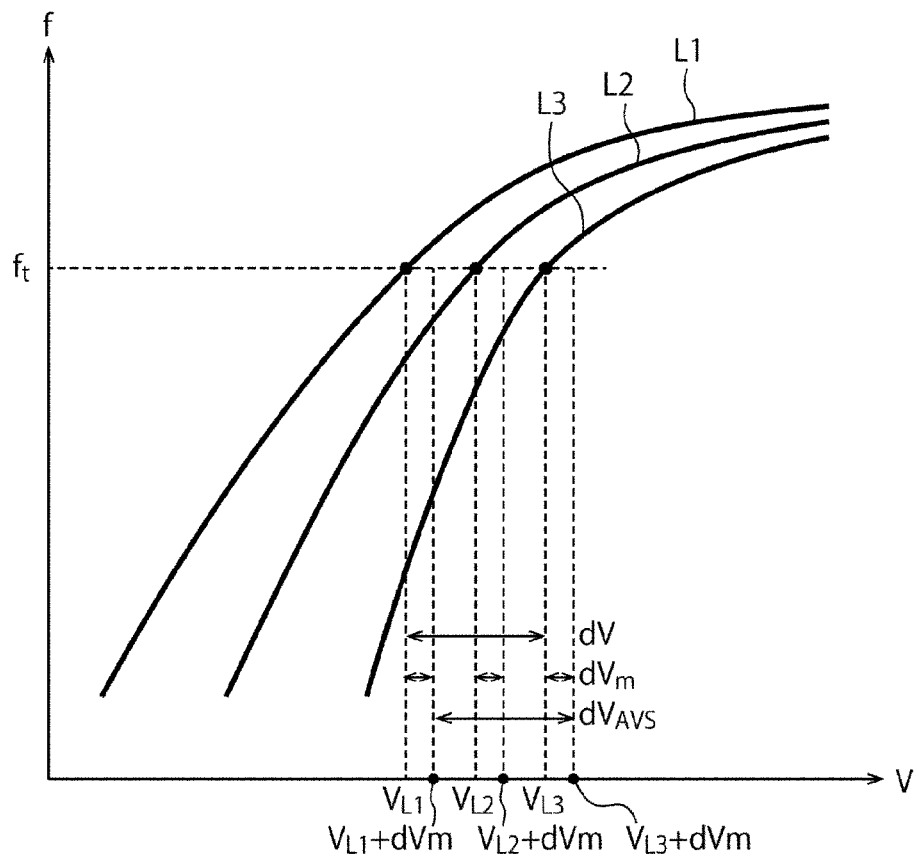
FIG. 5 is a graph showing the f-V characteristics of a general circuit.

FIG. 5 is a graph showing the f-V characteristics of a general circuit. The ordinate axis indicates frequency f, and the abscissa axis indicates power supply voltage V. The f-V characteristics are characteristics indicating the relationship between the operating frequency f of the circuit and the power supply voltage V. Normally, the operating frequency f becomes higher when the power supply voltage V is raised, and conversely, the operating frequency f becomes lower when the power supply voltage V is lowered, as shown in FIG. 5.

Where the target frequency is represented by ft, the power supply voltage V is subjected to AVS control so that operation is performed at the target frequency ft or higher even if the f-V characteristics of the critical path change due to production tolerance of circuits or temperature. For example, the circuit indicated by a line L1 operates at the target frequency ft even when the effective power supply voltage is $V_{L1}$, which is relatively low. The circuit indicated by a line L3 does not operate at the target frequency ft, unless the effective power supply voltage is $V_{L3}$, which is relatively high. The circuit indicated by a line L2 operates at the target frequency ft when the effective power supply voltage is a voltage $V_{L2}$, which is approximately in the middle between $V_{L1}$ and $V_{L3}$. In this manner, the lowest operating voltages ($V_{L1}$ to $V_{L3}$) required for operating at the target frequency ft vary depending on the production tolerance of the circuits or temperature. Further, it is necessary to add a voltage margin $dV_m$ to the respective lowest operating voltages ($V_{L1}$ to $V_{L3}$) of L1 to L3 so as to guarantee operations, taking into consideration errors due to the circuits and control thereon. Therefore, the target voltages of the circuits indicated by the lines L1 to L3 are $V_{L1}+dV_m$, $V_{L2}+dV_m$, and $V_{L3}+dV_m$, respectively. To operate all the circuits indicated by the lines L1 to L3 in a normal manner, the range of the lowest operating voltages is as indicated by dV, and the range of the effective power supply voltages in the AVS control is as indicated by $dV_{AVS}$, with the voltage margin $dV_m$ being taken into consideration.

In the AVS control, to guarantee the operating frequency of the circuit at the target frequency ft or higher, the effective power supply voltage needs to be equal to or higher than the sum of the lowest operating voltage and the voltage margin ($V_{L1}+dV_m$, $V_{L2}+dV_m$, or $V_{L3}+dV_m V_{L1}$ to $V_{L3}$). On the other hand, the voltage margin $dV_m$ to be added to the lowest operating voltage is preferably as small as possible, to lower the power consumption of the circuit. This is because an excessive voltage margin $dV_m$ will result in an unnecessary power loss.

Next, the f-V characteristics of the clock generation circuit 32 including the delay circuit 31 shown in FIG. 4 are described.

Figure 6:
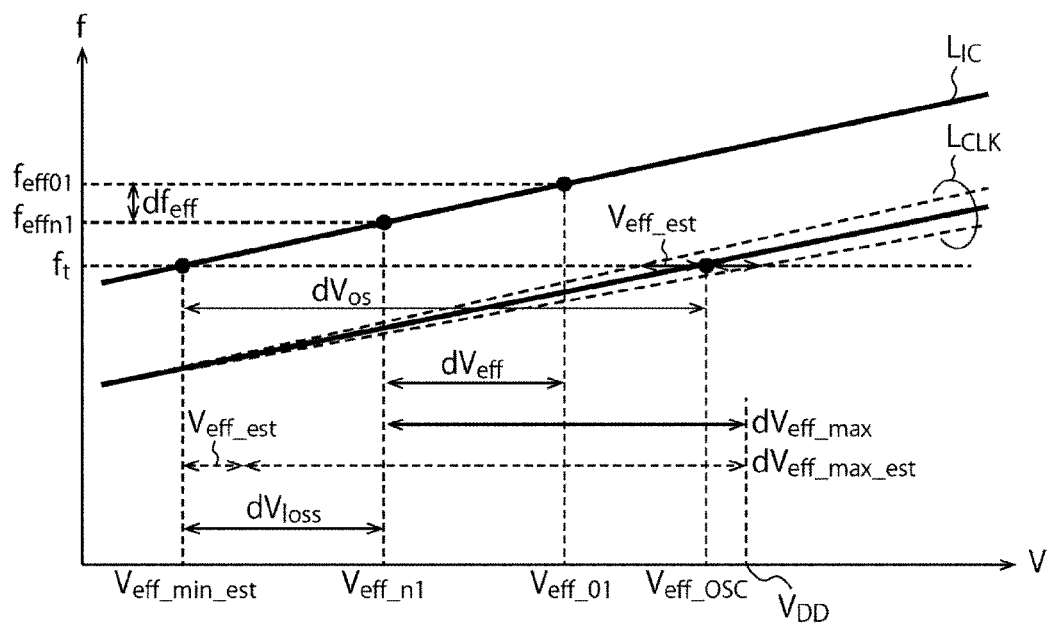
FIG. 6 is a graph showing the f-V characteristics of both a controlled circuit 2 and a clock generation circuit 32.

FIG. 6 is a graph showing the f-V characteristics of both the controlled circuit 2 and the clock generation circuit 32. A line $L_{IC}$ indicates the f-V characteristics of the internal circuit regions CI01 to ICnn of the controlled circuit 2. A line $L_{CLK}$ indicates the f-V characteristics of the clock generation circuit 32. Note that, in FIG. 6, the f-V characteristics of the controlled circuit 2 and the clock generation circuit 32 are indicated by straight lines for easy understanding, but the f-V characteristics may be curved as shown in FIG. 5. Further, in the description below, the ground voltage $V_{SS}$ is set to zero, and the effective power supply voltage of the controlled circuit 2 to be applied between the terminal T1 and the terminal T2 is the power supply voltage $V_{DD}$, for the sake of convenience.

In the controlled circuit 2, to obtain an operating frequency equal to or higher than the target frequency ft, a power supply voltage equal to or higher than an estimated minimum value $V_{eff\_min\_est}$ of the effective power supply voltage is required. The estimated minimum value $V_{eff\_min\_est}$ is an estimated value of the effective power supply voltage necessary for the critical path of the controlled circuit 2 to operate at the target frequency ft. On the other hand, the range of the power supply voltages to be actually applied to the internal circuit regions IC01 to ICnn of the controlled circuit 2 is from $V_{eff\_n1}$ to $V_{eff\_01}$. $V_{eff\_n1}$ is the effective power supply voltage to be applied to the internal circuit region ICn1 as shown in FIG. 2, and is the voltage difference between the terminal on the side the power supply circuit 10 and the terminal on the side of the ground GND in the internal circuit region ICn1. $V_{eff\_01}$ is the effective power supply voltage to be applied to the internal circuit region IC01, and is the voltage difference between the terminal on the side the power supply circuit 10 and the terminal on the side of the ground GND in the internal circuit region IC01. In the present disclosure, among the internal circuit regions IC01 to ICnn, the voltage $V_{eff\_n1}$ to be applied to the internal circuit region ICn1 is the lowest, and the voltage $V_{eff\_01}$ to be applied to the internal circuit region IC01 is the highest. In this case, the range $dV_{eff}$ of the effective power supply voltages of the internal circuit regions IC01 to ICnn in the controlled circuit 2 is from $V_{eff\_n1}$ to $V_{eff\_01}$.

The range $df_{eff}$ of the effective operating frequency of the controlled circuit 2 for the range $dV_{eff}$ of the effective power supply voltages is from $f_{eff\_n1}$ to $f_{eff\_01}$. The controlled circuit 2 operates in the range $df_{eff}$ of the effective operating frequencies at the power supply voltages in the range $dV_{eff}$ of the effective power supply voltages.

Meanwhile, the clock generation circuit 32 receives inputs of the power supply voltage $V_{DD}$ and the ground voltage $V_{SS}$ as power supply voltages. Therefore, taking into consideration the effective power supply voltage of the internal circuit regions ICn1 to ICnn (which is the critical path) having the largest voltage drop among the internal circuit regions IC01 to ICnn, the clock generation circuit 32 adds the delay circuit 31 to the replica circuit 30. Since the delay circuit 31 functions to lower the frequency of the clock signal CLK, the power supply voltage control circuit 20 raises the target voltage, to make the clock signal CLK equal to the target frequency ft. With this arrangement, the power supply circuit 10 can apply the high power supply voltage $V_{DD}$ to the controlled circuit 2, taking into consideration the voltage drop in the effective power supply voltage to the critical path. As a result, all the internal circuit regions in the controlled circuit 2 including the critical path can operate correctly.

As the delay circuit 31 is added, the f-V characteristics of the clock generation circuit 32 indicated by the line $L_{CLK}$ have an offset voltage $dV_{OS}$ for the f-V characteristics of the controlled circuit 2 indicated by the line $L_{IC}$. For example, because of the addition of the delay circuit 31, the effective power supply voltage $V_{eff\_OSC}$ to be applied to the clock generation circuit 32 is set at a voltage that is higher than the estimated minimum value $V_{eff\_min\_est}$ of the effective power supply voltage by the amount equivalent to the offset voltage $dV_{OS}$.

With the voltage drop from the power supply voltage $V_{DD}$ to the clock generation circuit 32 being taken into consideration, the target voltage of the power supply voltage $V_{DD}$ is set at a voltage that is slightly higher than the effective power supply voltage $V_{eff\_OSC}$ of the clock generation circuit 32 by the amount equivalent to the voltage drop.

Here, the maximum value $dV_{eff\_max}$ of an actual voltage drop is the voltage difference between the power supply voltage $V_{DD}$ and the effective power supply voltage $V_{eff\_n1}$ of the internal circuit region ICn1. Therefore, it should be sufficient that the power supply voltage $V_{DD}$ is a voltage ($V_{eff\_min\_est}+dV_{eff\_max}$) that is higher than the estimated minimum value $V_{eff\_min\_est}$ of the effective power supply voltage by the amount equivalent to the maximum value $dV_{eff\_max}$ of an actual voltage drop.

However, in a case where the clock generation circuit 32 including the delay circuit 31 is used, the power supply voltage $V_{DD}$ is set at a voltage that is higher than the voltage ($V_{eff\_min\_est}+dV_{eff\_max}$) by the amount equivalent to an excessive voltage margin $dV_{loss}$. The reasons why the excessive voltage margin $dV_{loss}$ is required are as follows.

First, a voltage drop from the power supply voltage $V_{DD}$ to the critical path is estimated, and the power supply voltage $V_{DD}$ is set. Therefore, the delay circuit 31 is designed such that the estimated maximum value $dV_{eff\_max\_est}$ of a voltage drop is larger than the maximum value $dV_{eff\_max}$ of an actual voltage drop. The estimated maximum value $dV_{eff\_max\_est}$ of the voltage drop is set, taking into consideration the production tolerance of the controlled circuit 2 and the clock generation circuit 32, characteristic changes due to temperature, transient changes, and the like.

Further, as the delay circuit 31 is added to the replica circuit 30, a structural difference is caused between the critical path and the clock generation circuit 32. This structural difference will lead to degradation in the accuracy of correlation between the critical path and the clock generation circuit 32. For example, because of the addition of the delay circuit 31, the f-V characteristics of the clock generation circuit 32 causes a correlation error as indicated by dashed lines in the line $L_{CLK}$ in FIG. 6. The estimated voltage of fluctuation in the power supply voltage due to the correlation error is represented by $V_{err\_est}$. Such an estimated error voltage $V_{err\_est}$ is also added to the estimated maximum value $dV_{eff\_max\_est}$ of the voltage drop, and the target voltage of the power supply voltage $V_{DD}$ is set. For such reasons, the clock generation circuit 32 requires the excessive voltage margin $dV_{loss}$.

Next, the f-V characteristics of the clock generation circuit 30 according to the present disclosure are described.

Figure 7:
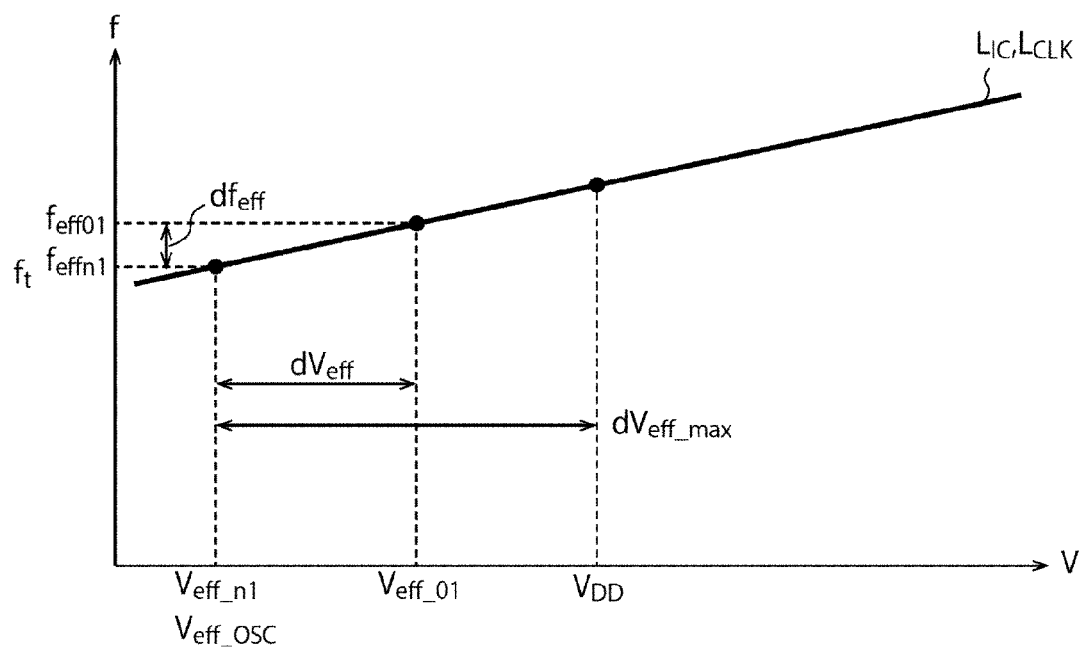
FIG. 7 is a graph showing an example of the f-V characteristics of a controlled circuit and a clock generation circuit according to the first embodiment.

FIG. 7 is a graph showing an example of the f-V characteristics of the controlled circuit 2 and the clock generation circuit 30 according to the first embodiment. The clock generation circuit 30 is a replica circuit having the same configuration as the critical path (the internal circuit regions ICn1 to ICnn), and does not include the delay circuit 31. Further, the clock generation circuit 30 operates receiving the effective power supply voltage to be applied to the internal circuit regions ICn1 to ICnn serving as the critical path. Therefore, the f-V characteristics of the controlled circuit 2 and the clock generation circuit 30 substantially overlap each other without having any offset, as indicated by lines $L_{IC}$ and $L_{CLK}$.

As described above, the clock generation circuit 30 according to the present disclosure receives the effective power supply voltage $V_{eff\_OSC}$ that is the internal voltage (a lower voltage than the power supply voltage $V_{DD}$) to be applied to the critical path. Accordingly, there is no need to take into consideration the voltage drop from the power supply voltage $V_{DD}$ to the critical path. Thus, setting of the estimated maximum value $dV_{eff\_max\_est}$ of the voltage drop is unnecessary, and there is no need to include the additional delay circuit 31.

Since the additional delay circuit 31 is unnecessary, the critical path and the clock generation circuit 30 have the same configuration in structural terms, and the correlation error between the critical path and the clock generation circuit 30 is substantially eliminated. That is, it is not necessary to take into consideration the estimated error voltage $V_{err\_est}$ of the power supply voltage due to a correlation error. As a result, the excessive voltage margin $dV_{loss}$ becomes substantially unnecessary.

In this case, the effective power supply voltage $V_{eff\_n1}$ of the internal circuit region ICn1 and the effective power supply voltage $V_{eff\_OSC}$ of the clock generation circuit 30 become substantially equal. Also, the operating frequency $f_{eff\_n1}$ of the internal circuit region ICn1 is substantially equal to the target frequency ft. The target voltage of the power supply voltage $V_{DD}$ is only required to be set at the voltage obtained by adding the maximum value $dV_{eff\_max}$ of an actual voltage drop from the effective power supply voltage $V_{eff\_n1}$ and the effective power supply voltage $V_{eff\_OSC}$.

With this arrangement, the voltage control device 1 can lower power consumption by bringing the effective power supply voltage $V_{eff\_n1}$ of the controlled circuit 2 close to the lowest operating voltage while maintaining the effective power supply voltage $V_{eff\_n1}$ at the lowest operating voltage or higher.

Note that, in the first embodiment, the clock generation circuit 30 is a replica circuit having the same configuration as the critical path, and receives the power supply voltage from the internal voltage having the largest voltage drop from the power supply voltage $V_{DD}$. That is, the clock generation circuit 30 receives the power supply voltage from the internal circuit regions ICn1 to ICnn having the lowest effective power supply voltage.

However, in a case where the critical path cannot be identified, the clock generation circuit 30 may obtain the effective power supply voltage $V_{eff\_OSC}$ from the internal circuit region in which the effective power supply voltage is as low as possible. In this case, there is a possibility that the circuit scale of the critical path might become larger, or an additional delay circuit might be required. However, the clock generation circuit 30 can make the voltage margin $dV_{loss}$ smaller than that of the clock generation circuit 32 that receives the power supply voltage $V_{DD}$.

Alternatively, the clock generation circuit 30 may receive the effective power supply voltage $V_{eff\_OSC}$ that is an internal voltage having a voltage drop larger than half the voltage difference between the power supply voltage $V_{DD}$ and the internal voltage having the largest voltage drop from the power supply voltage $V_{DD}$, for example. That is, the effective power supply voltage $V_{eff\_OSC}$ may be an internal voltage having a voltage drop larger than half the largest voltage drop. With this arrangement, the effective power supply voltage $V_{eff\_OSC}$ of the clock generation circuit 30 can be obtained from the internal power supply in the internal circuit region as close to the critical path as possible.

Alternatively, the clock generation circuit 30 may receive the effective power supply voltage $V_{eff\_OSC}$ from the internal circuit region at which the wiring distance from the terminal T1 or T2 is as long as possible. For example, in a case where the wiring distance from the terminal T1 to the internal circuit region IC1n is longer than the wiring distance from the terminal T1 to the internal circuit region IC0n, the clock generation circuit 30 receives a high-voltage power supply from the high-voltage-side terminal (the node NH1n) of the internal circuit region IC1n. In a case where the wiring distance from the terminal T2 to the internal circuit region IC11 is longer than the wiring distance from the terminal T2 to the internal circuit region IC01, the clock generation circuit 30 receives a low-voltage power supply from the low-voltage-side terminal (the node NL11) of the internal circuit region IC11. With this arrangement, the clock generation circuit 30 receives the voltage difference between the node NH1n and the node NL11 as the effective power supply voltage $V_{eff\_OSC}$. Thus, the effective power supply voltage $V_{eff\_OSC}$ of the clock generation circuit 30 can be obtained from the internal power supply in an internal circuit region close to the critical path.

Alternatively, the clock generation circuit 30 may receive a high-voltage power supply from an internal circuit region at a longer distance than half the longest distance among the plurality of wiring distances from the terminal T1 to the plurality of internal circuit regions IC01 to ICnn, for example. Also, the clock generation circuit 30 may receive a low-voltage power supply from an internal circuit region located at a position at a longer distance than half the longest distance among the plurality of wiring distances from the terminal T2 to the plurality of internal circuit regions IC01 to ICnn. In this manner, the effective power supply voltage $V_{eff\_OSC}$ of the clock generation circuit 30 can also be obtained from the internal power supply in an internal circuit region close to the critical path.

Further, the clock generation circuit 30 may receive the effective power supply voltage $V_{eff\_OSC}$ from the internal circuit region at which the linear distance from the terminal T1 or T2 is as long as possible in the planar layout. For example, in a case where the linear distance from the terminal T1 to the internal circuit region IC1n is longer than the linear distance from the terminal T1 to the internal circuit region IC0n, the clock generation circuit 30 receives a high-voltage power supply from the high-voltage-side terminal (the node NH1n) of the internal circuit region IC1n. In a case where the linear distance from the terminal T2 to the internal circuit region IC11 is longer than the linear distance from the terminal T2 to the internal circuit region IC01, the clock generation circuit 30 receives a low-voltage power supply from the low-voltage-side terminal (the node NL11) of the internal circuit region IC11. With this arrangement, the clock generation circuit 30 receives the voltage difference between the node NH1n and the node NL11 as the effective power supply voltage $V_{eff\_OSC}$. Thus, the effective power supply voltage $V_{eff\_OSC}$ of the clock generation circuit 30 can be obtained from the internal power supply in an internal circuit region close to the critical path.

Alternatively, the clock generation circuit 30 may receive a high-voltage power supply from an internal circuit region located at a position at a longer distance than half the longest distance among the linear distances from the terminal T1 to the plurality of internal circuit regions IC01 to ICnn, for example. Also, the clock generation circuit 30 may receive a low-voltage power supply from an internal circuit region located at a position at a longer distance than half the longest distance among the linear distances from the terminal T2 to the plurality of internal circuit regions IC01 to ICnn. In this manner, the effective power supply voltage $V_{eff\_OSC}$ of the clock generation circuit 30 can also be obtained from the internal power supply in an internal circuit region close to the critical path.

According to the first embodiment, the clock generation circuit 30 also uses an internal voltage of the controlled circuit 2 as an effective power supply voltage. With this arrangement, the clock generation circuit 30 can change the frequency of the clock signal CLK with transient voltage fluctuations of the power supply voltage $V_{DD}$, and prevent the occurrence of a timing error in the controlled circuit 2 (an adaptive clocking technology).

Second Embodiment

Figure 8:
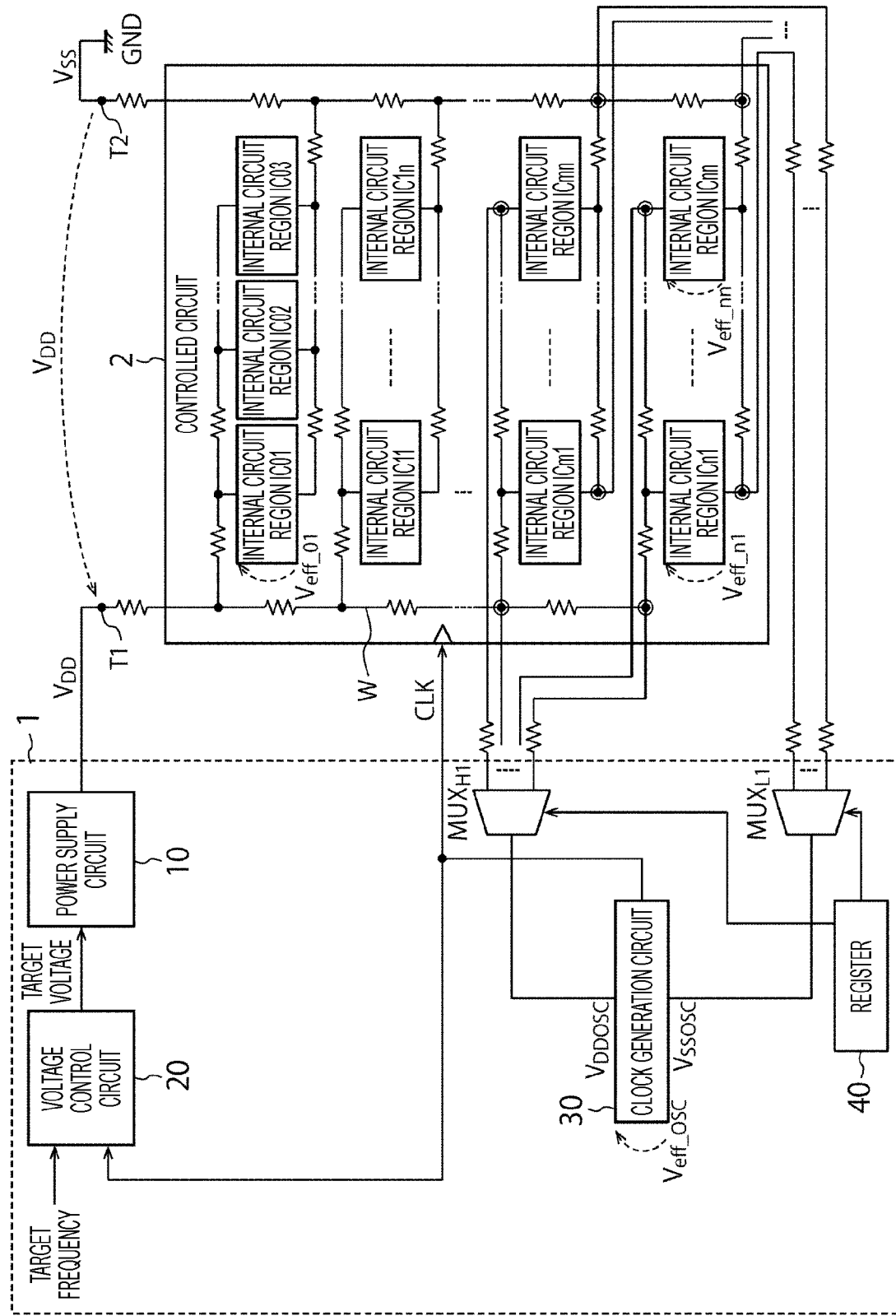
FIG. 8 is a block diagram showing the connection relationship between a voltage control device and a controlled circuit according to a second embodiment.

FIG. 8 is a block diagram showing the connection relationship between a voltage control device 1 and a controlled circuit 2 according to a second embodiment. The voltage control device 1 according to the second embodiment supplies the lowest internal voltage selected from a plurality of internal circuit regions IC01 to ICnn as the effective power supply voltage $V_{\mathit{eff\_OSC}}$ to a clock generation circuit 30. The voltage control device 1 according to the second embodiment further includes a multiplexer $MUX_{H1}$, a multiplexer $MUX_{L1}$, and a register 40. The other components of the second embodiment may be similar to the corresponding components of the first embodiment.

The multiplexer $MUX_{H1}$ as a selection circuit is connected to the high-voltage terminals of the plurality of internal circuit regions IC01 to ICnn in the controlled circuit 2, and receives an input of a plurality of high-voltage power supplies to be applied to the internal circuit regions. The multiplexer $MUX_{H1}$ then selects the power supply having the lowest voltage from the plurality of high-voltage power supplies. The selected high-voltage power supply is input to the high-voltage power supply $V_{DDOSC}$ of the clock generation circuit 30.

The multiplexer $MUX_{L1}$ as the other selection circuit is connected to the low-voltage terminals of the plurality of internal circuit regions IC01 to ICnn in the controlled circuit 2, and receives an input of a plurality of low-voltage power supplies to be applied to the internal circuit regions IC01 to ICnn. The multiplexer $MUX_{L1}$ then selects the power supply having the highest voltage from the plurality of low-voltage power supplies. The selected low-voltage power supply is input to the low-voltage power supply $V_{SSOSC}$ of the clock generation circuit 30.

With this arrangement, the clock generation circuit 30 can generate a clock signal on the basis of the lowest effective power supply voltage among the effective power supply voltages of the internal circuit regions IC01 to ICnn.

The register 40 as a storage unit stores information for determining which high-voltage power supply and which low-voltage power supply should be selected from the plurality of high-voltage power supplies and the plurality of low-voltage power supplies input to the multiplexers $MUX_{H1}$ and $MUX_{L1}$. For example, the effective power supply voltages or the operating frequencies of the internal circuit regions IC01 to ICnn are measured in advance, and the register 40 stores information indicating the internal circuit region having the lowest effective power supply voltage or the lowest operating frequency.

The multiplexers $MUX_{H1}$ and $MUX_{L1}$ receive inputs of the high-voltage power supplies and the low-voltage power supplies from all or some of the internal circuit regions IC01 to ICnn, select the lowest high-voltage power supply and the highest low-voltage power supply on the basis of the information obtained from the register 40, and output the selected power supplies to the clock generation circuit 30. Alternatively, the multiplexers $MUX_{H1}$ and $MUX_{L1}$ may receive inputs of the high-voltage power supplies and the low-voltage power supplies from a plurality of internal circuit regions relatively far from the terminal T1 (or the terminal T2) in terms of wiring distance or linear distance, select the lowest high-voltage power supply and the highest low-voltage power supply from among the received power supplies, and output the selected power supplies to the clock generation circuit 30. In this case, the register 40 is only required to store information about the internal circuit region having the longest wiring distance or linear distance from the terminal T or T2 among the internal circuit regions IC01 to ICnn.

In a case where the internal voltages of some of the internal circuit regions IC01 to ICnn are supplied to the multiplexers $MUX_{H1}$ and $MUX_{L1}$, the internal voltages of a plurality of internal circuit regions in which the voltage drop from the power supply voltage $V_{DD}$ is equal to or larger than a certain threshold are only required to be supplied to the multiplexers $MUX_{H1}$ and $MUX_{L1}$. Alternatively, the internal voltages of the internal circuit regions whose wiring distances or linear distances from the terminal T1 (or the terminal T2) are equal to or longer than a certain threshold may be supplied to the multiplexers $MUX_{H1}$ and $MUX_{L1}$. With this arrangement, the number of wiring lines from the internal circuit regions to the multiplexers $MUX_{H1}$ and $MUX_{L1}$ can be reduced, and the voltage control device 1 or the controlled circuit 2 can be made smaller in size.

Further, when the distribution of the consumption current of the controlled circuit 2 changes depending on the operating state, the critical path may change in some cases. In such a case, the register 40 is only required to store a look-up table storing information about each operating state associated with information about the internal circuit regions corresponding to the critical path in each operating state. The multiplexers $MUX_{H1}$ and $MUX_{L1}$ are only required to dynamically select the effective power supply voltage for the critical path in accordance with the operating state of the controlled circuit 2, by referring to the look-up table in the register 40. With this arrangement, the voltage control device 1 can perform AVS control on the controlled circuit 2, using an appropriate power supply voltage $V_{DD}$ in a plurality of operating states of the controlled circuit 2.

The multiplexers $MUX_{H1}$ and $MUX_{L1}$ may also compare the high-voltage power supplies and the low-voltage power supplies from all or some of the internal circuit regions IC01 to ICnn, using a comparator such as a differential amplifier circuit, and select the lowest high-voltage power supply and the highest low-voltage power supply. Even in this case, the voltage control device 1 can set an appropriate power supply voltage $V_{DD}$ in a plurality of operating states of the controlled circuit 2. Also, in this case, the register 40 can be excluded.

As described above, the voltage control device 1 according to the second embodiment can select a high-voltage power supply and a low-voltage power supply from among the effective power supply voltages of a plurality of internal circuit regions, and use the high-voltage power supply and the low-voltage power supply as the effective power supply voltage $V_{\mathit{eff\_OSC}}$ of the clock generation circuit 30. With this arrangement, the voltage control device 1 can dynamically select an appropriate effective power supply voltage $V_{\mathit{eff\_OSC}}$ for the clock generation circuit 30. The second embodiment can also achieve the effects of the first embodiment.

Third Embodiment

Figure 9:
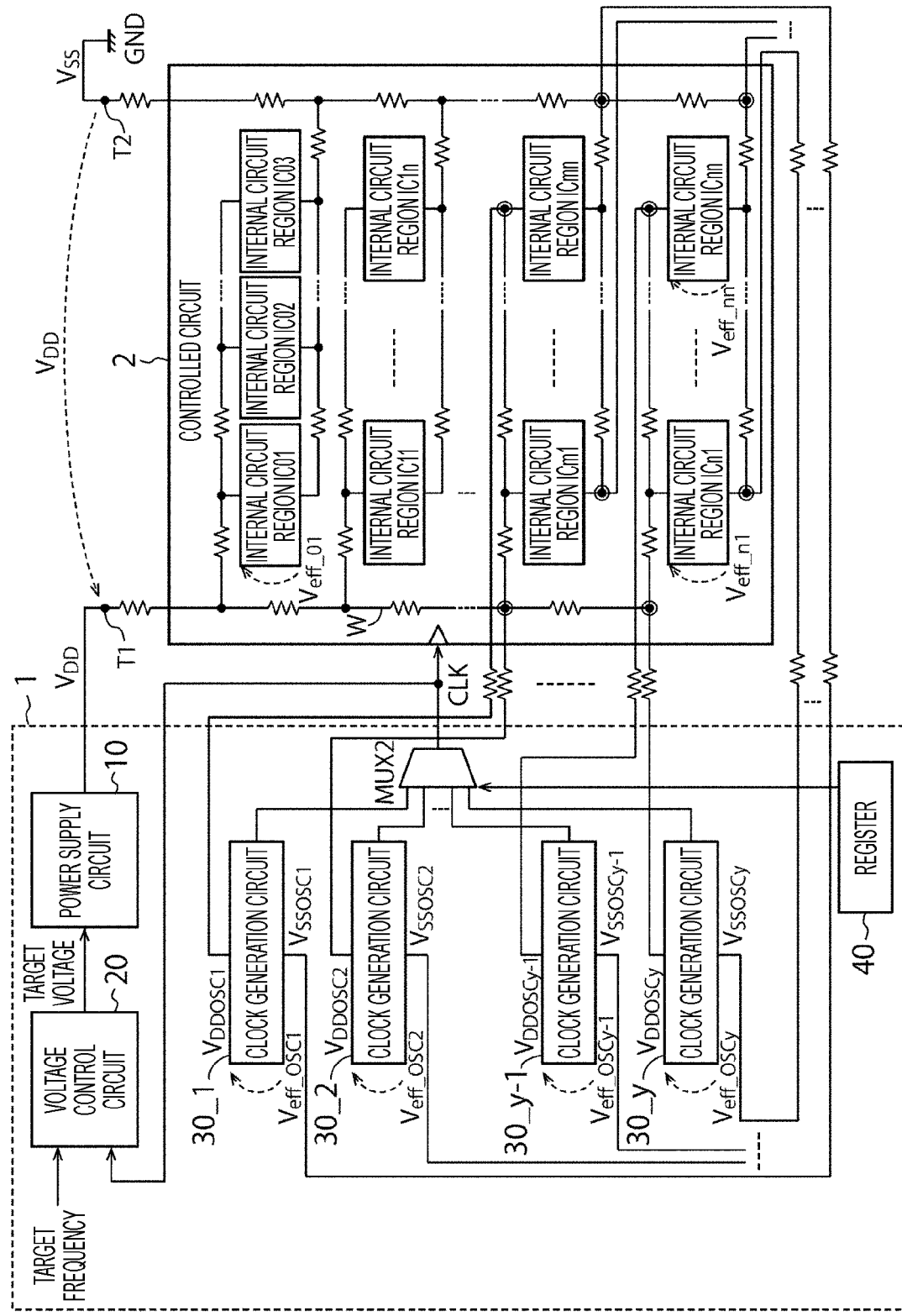
FIG. 9 is a block diagram showing the connection relationship between a voltage control device and a controlled circuit according to a third embodiment.

FIG. 9 is a block diagram showing the connection relationship between a voltage control device 1 and a controlled circuit 2 according to a third embodiment. The voltage control device 1 according to the third embodiment selects the clock signal having the lowest frequency from a plurality of clock signals supplied from a plurality of clock generation circuits 30_1 to 30_y, and supplies the selected clock signal to the controlled circuit 2. Note that y is a positive integer.

The voltage control device 1 according to the third embodiment further includes the plurality of clock generation circuits 30_1 to 30_y, a multiplexer MUX2, and a register 40. The other components of the third embodiment may be similar to the corresponding components of the first embodiment.

The plurality of clock generation circuits 30_1 to 30_y receives all or some of a plurality of internal voltages to be applied to a plurality of internal circuit regions IC01 to ICnn as effective power supply voltages $V_{\mathit{eff\_OSC1}}$ to $V_{\mathit{eff\_OSCy}}$, respectively. The clock generation circuits 30_1 to 30_y then generate a plurality of clock signals on the basis of the effective power supply voltages $V_{\mathit{eff\_OSC1}}$ to $V_{\mathit{eff\_OSCy}}$, respectively. The frequencies of the plurality of clock signals generated at this point of time are frequencies corresponding to the effective power supply voltages $V_{\mathit{eff\_OSC1}}$ to $V_{\mathit{eff\_OSCy}}$, on the basis of the f-V characteristics of the clock generation circuits 30_1 to 30_y.

The multiplexer MUX2 as a selection circuit receives an input of the plurality of clock signals from the plurality of clock generation circuits 30_1 to 30_y, and selects the clock signal having the lowest frequency from the plurality of clock signals. As described above, the lower the effective power supply voltage, the lower the frequency of the clock signal. Therefore, the clock signal having the lowest frequency corresponds to the lowest effective power supply voltage. That is, it can be said that the clock signal having the lowest frequency is the clock signal output from the clock generation circuit (any one of 30_1 to 30_y) that has received the internal voltage of the critical path. The power supply voltage control circuit 20 controls the power supply voltage $V_{DD}$ so that such a clock signal having the lowest frequency is equal to the target frequency ft. With this arrangement, the entire internal circuit regions IC01 to ICnn including the critical path in the controlled circuit 2 can operate correctly.

The register 40 as a storage unit stores information about the clock generation circuit that outputs the clock signal having the lowest frequency. For example, the effective power supply voltages or the operating frequencies of the internal circuit regions IC01 to ICnn are measured in advance, and the register 40 stores information indicating the internal circuit region having the lowest effective power supply voltage or the lowest operating frequency.

The multiplexer MUX2 receives inputs of the clock signals from the clock generation circuits 30_1 to 30_y, selects the clock signal having the lowest frequency on the basis of the information obtained from the register 40, and outputs the selected clock signal to the controlled circuit 2.

The clock generation circuits 30_1 to 30_y may correspond to all the internal circuit regions IC01 to ICnn, or may correspond to some of the internal circuit regions. In a case where the clock generation circuits 30_1 to 30_y correspond to some of the internal circuit regions, the clock generation circuits may be provided for the internal circuit regions in which the voltage drop, the wiring distance, or the linear distance is equal to or greater than a threshold, as in the second embodiment. With this arrangement, the number of clock generation circuits 30_1 to 30_y can be reduced. Also, the number of wiring lines from the internal circuit regions to the clock generation circuits 30_1 to 30_y can be reduced. As a result, the voltage control device 1 or the controlled circuit 2 can be made smaller in size.

Further, in a case where the critical path changes depending on the operating state of the controlled circuit 2, the register 40 is only required to store a look-up table storing information about each operating state associated with information about the internal circuit regions corresponding to the critical path in each operating state. The multiplexer MUX2 is only required to dynamically select the clock signal corresponding to the critical path in accordance with the operating state of the controlled circuit 2, by referring to the look-up table in the register 40. With this arrangement, the voltage control device 1 can perform AVS control on the controlled circuit 2, using an appropriate power supply voltage $V_{DD}$ in a plurality of operating states of the controlled circuit 2.

Using a low-pass filter circuit or the like, the multiplexer MUX2 may compare the frequencies of the clock signals supplied from the clock generation circuits 30_1 to 30_y, and select the clock signal having the lowest frequency. Even in this case, the voltage control device 1 can set an appropriate power supply voltage $V_{DD}$ in a plurality of operating states of the controlled circuit 2. Also, in this case, the register 40 can be excluded. In this case, the register 40 may store a plurality of look-up tables corresponding to the plurality of operating states.

The clock generation circuits corresponding to the unselected clock signals may stop the clock generation operation. Thus, the power consumption by the voltage control device 1 can be further lowered.

As described above, the voltage control device 1 according to the third embodiment selects the clock signal having the lowest frequency from among the clock signals obtained from the effective power supply voltages of the plurality of internal circuit regions, and supplies the clock signal having the lowest frequency to the controlled circuit 2. By doing so, the voltage control device 1 can also dynamically select an appropriate effective power supply voltage $V_{\mathit{eff\_OSC}}$ for the clock generation circuit 30. The third embodiment can also achieve the effects of the first embodiment.

Fourth Embodiment

Figure 10:
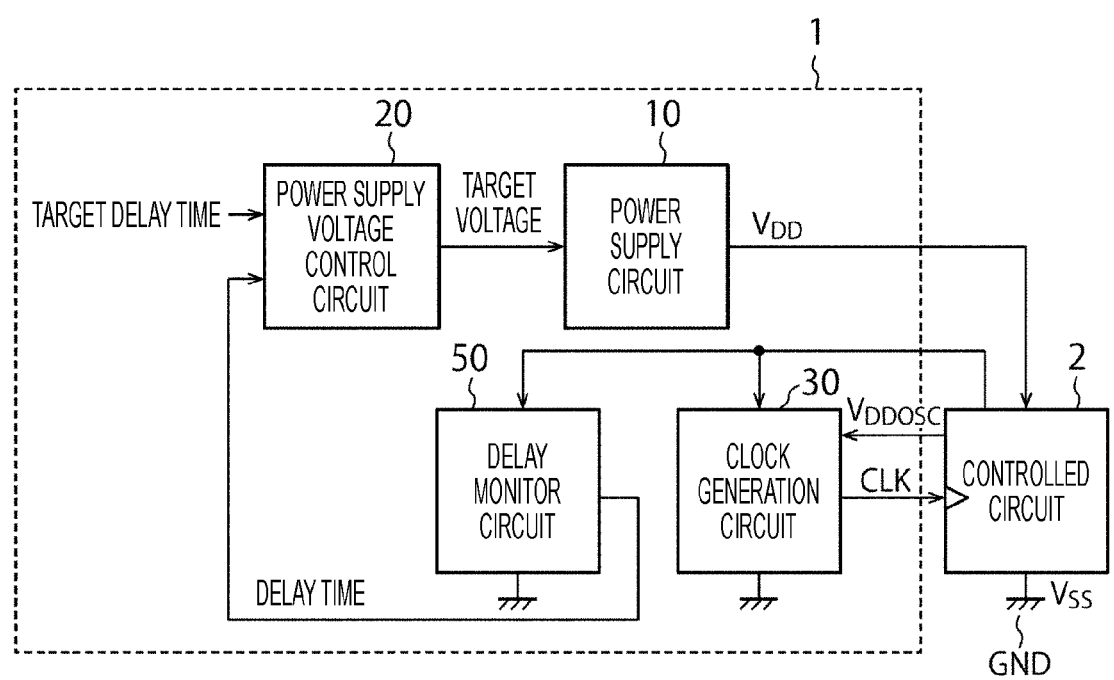
FIG. 10 is a block diagram showing an example configuration of a voltage control device and a controlled circuit according to a fourth embodiment.

FIG. 10 is a block diagram showing an example configuration of a voltage control device 1 and a controlled circuit 2 according to a fourth embodiment. The voltage control device 1 according to the fourth embodiment further includes a delay monitor circuit 50, separately from the clock generation circuit 30. Like the clock generation circuit 30, the delay monitor circuit 50 includes a circuit having the same configuration as the critical path or a circuit having substantially the same f-V characteristics as the critical path. The delay monitor circuit 50 receives the power supply voltage $V_{DDOSC}$ from the controlled circuit 2, measures the delay time in the critical path, and feeds back information about the delay time to the power supply voltage control circuit 20. On the other hand, the clock generation circuit 30 receives the power supply voltage $V_{DDOSC}$ from the controlled circuit 2, and supplies the clock signal CLK to the controlled circuit 2, but does not feed back the clock signal CLK to the power supply voltage control circuit 20. That is, in the fourth embodiment, the clock generation circuit 30 that generates the clock signal CLK, and the delay monitor circuit 50 for setting the power supply voltage $V_{DD}$ are provided separately from each other. The other components of the fourth embodiment may be similar to the corresponding components of the first embodiment.

The internal configuration of the delay monitor circuit 50 will be described later with reference to FIGS. 12 to 14. Further, the internal configuration of the clock generation circuit 30 may also be a configuration shown in FIG. 15 or 16, in addition to the configuration shown in FIG. 3.

Fifth Embodiment

Figure 11:
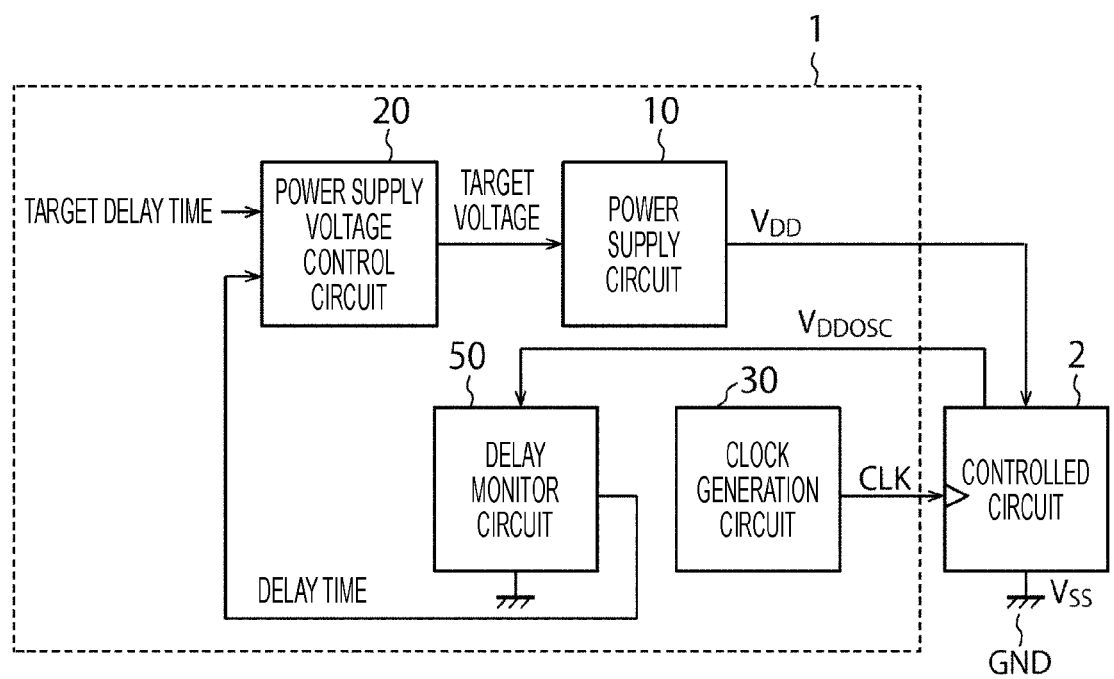
FIG. 11 is a block diagram showing an example configuration of a voltage control device and a controlled circuit according to a fifth embodiment.

FIG. 11 is a block diagram showing an example configuration of a voltage control device 1 and a controlled circuit 2 according to a fifth embodiment. The voltage control device 1 according to the fifth embodiment also further includes a delay monitor circuit 50, separately from the clock generation circuit 30, as in the fourth embodiment. However, the clock generation circuit 30 generates the clock signal CLK having a certain frequency, and does not receive an internal voltage from the controlled circuit 2 as the power supply voltage $V_{DDOSC}$. The clock generation circuit 30 may be a crystal oscillator, an LC or RC oscillator, a phase-locked loop (PLL) circuit, a digital locked loop (DLL) circuit, or the like, for example.

According to the fifth embodiment, the clock generation circuit 30 does not use the internal voltage of the controlled circuit 2 as the effective power supply voltage, and therefore, cannot use the adaptive clocking technology described above. However, the frequency of the clock signal CLK can be stably maintained at a constant value.

The other components of the fifth embodiment may be similar to the corresponding components of the fourth embodiment.

(Configuration of the Delay Monitor Circuit 50)

Here, the internal configuration of the delay monitor circuit 50 according to the fourth and fifth embodiments is described.

Figure 12:
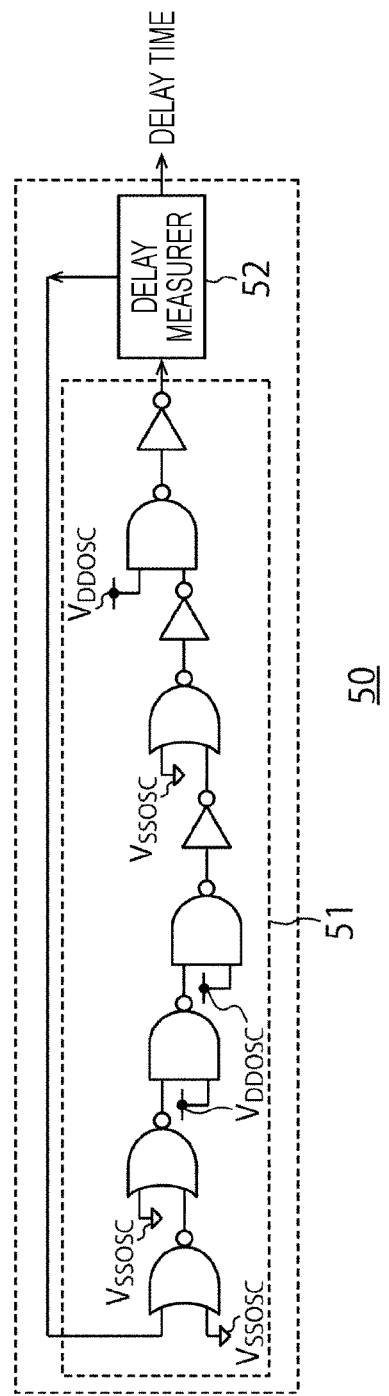
FIG. 12 is a circuit diagram showing an example configuration of a delay monitor circuit.

FIG. 12 is a circuit diagram showing an example configuration of the delay monitor circuit 50. The delay monitor circuit 50 includes a delay circuit 51 and a delay measurer 52. The delay circuit 51 may be a circuit having substantially the same configuration as that of the clock generation circuit 30, or is a circuit having substantially the same f-V characteristics as those of the clock generation circuit 30. That is, the delay circuit 51 is a circuit having substantially the same configuration or substantially the same f-V characteristics as the critical path. The delay measurer 52 is connected between the output and the input of the delay circuit 51, and measures the time (the pulse width of the clock signal CLK) from the rising time point till the falling time point of the output of the delay circuit 51. Alternatively, the delay measurer 52 may measure the time from the falling time point till the rising time point of the output of the delay circuit 51. That is, the delay measurer 52 measures the delay time from the input to the output of the delay circuit 51. The delay time may be the average value of a plurality of pulse widths. Information about this delay time is fed back to the power supply voltage control circuit 20.

The power supply voltage control circuit 20 receives the information about the delay time, and sets the target voltage such that the delay time becomes equal to the target delay time. Because the delay time is a reciprocal of (inversely proportional to) the frequency of the clock signal CLK, it is also possible to set the target voltage of the power supply voltage $V_{DD}$, using the delay time, instead of frequency. The delay monitor circuit 50 may of course output the frequency of the delay circuit 51. In this case, the power supply voltage control circuit 20 is only required to set the target voltage on the basis of the frequency output from the delay monitor circuit 50.

(First Modification of the Delay Monitor Circuit 50)

Figure 13:
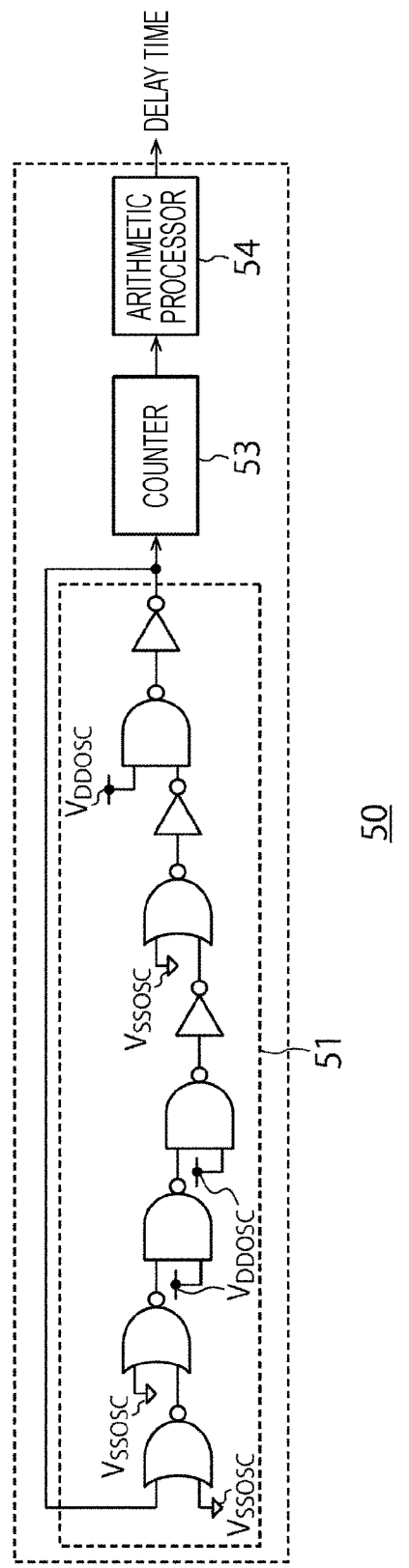
FIG. 13 is a circuit diagram showing another example configuration of a delay monitor circuit.

FIG. 13 is a circuit diagram showing another example configuration of the delay monitor circuit 50. The delay monitor circuit 50 includes a delay circuit 51, a counter 53, and an arithmetic processor 54.

The counter 53 is connected between the output of the delay circuit 51 and the input of the arithmetic processor 54, and counts the number of times the output of the delay circuit 51 is inverted (the number of times the clock signal CLK is inverted) within a predetermined period.

The arithmetic processor 54 is connected to the output of the counter 53, and receives the number of times the output of the delay circuit 51 is inverted. The arithmetic processor 54 measures the delay time, on the basis of the predetermined time and the number of times the output of the delay circuit 51 is inverted. Information about this delay time is fed back to the power supply voltage control circuit 20.

Operation of the power supply voltage control circuit 20 is as described above with reference to FIG. 12.

(Second Modification of the Delay Monitor Circuit 50)

Figure 14:
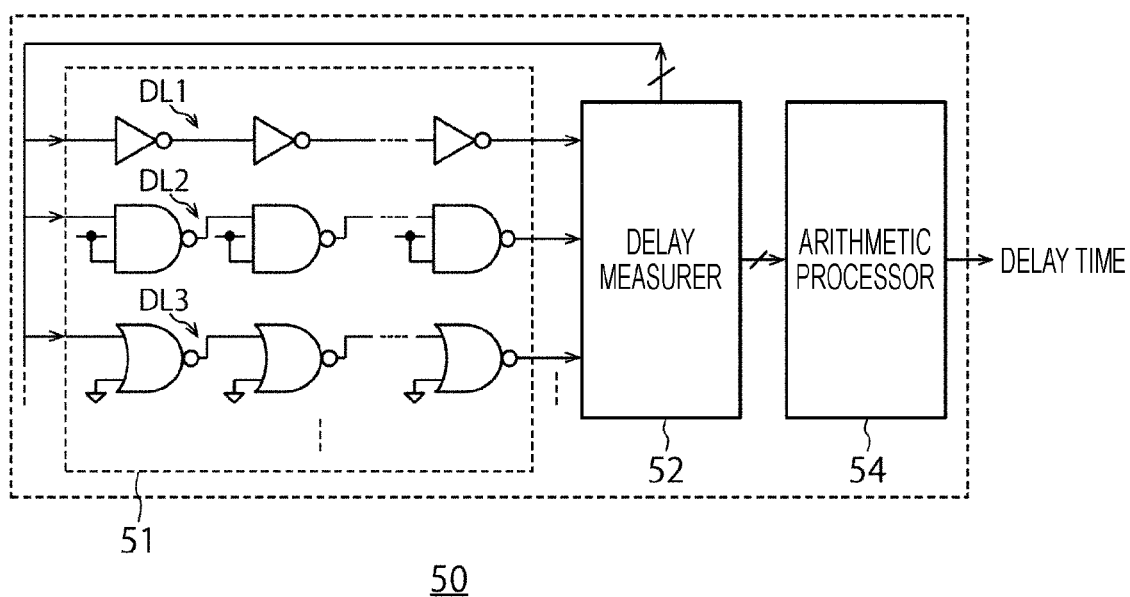
FIG. 14 is a circuit diagram showing yet another example configuration of a delay monitor circuit.

FIG. 14 is a circuit diagram showing yet another example configuration of the delay monitor circuit 50. The delay monitor circuit 50 is the same as the delay monitor circuit 50 shown in FIG. 13, in including a delay circuit 51, a counter 53, and an arithmetic processor 54. However, the configuration of the delay circuit 51 differs from that shown in FIG. 13.

The delay circuit 51 in FIG. 14 includes different delay rows DL1, DL2, DL3, . . . that are connected in parallel to the delay measurer 52. Each of the delay rows DL1, DL2, DL3, . . . is formed with a plurality of identical delay elements connected in series. However, the configuration of each of the delay rows DL1, DL2, DL3, . . . is not necessarily such a configuration, and have different f-V characteristics. The delay elements may be logic circuits such as inverter circuits, NAND operation circuits, or NOR operation circuits, for example. The delay measurer 52 selects one of the delay rows DL1, DL2, DL3, . . . , on the basis of information supplied from the register 40, for example. The delay measurer 52 measures the delay time, using a pulse signal obtained from the selected delay row. With this arrangement, the voltage control device 1 can select a delay row having appropriate f-V characteristics in accordance with the operating state of the controlled circuit 2, and perform AVS control on the controlled circuit 2, using an appropriate power supply voltage $V_{DD}$.

The other components and operations of the delay monitor circuit 50 in FIG. 14 may be the same as the components and operations illustrated in FIG. 13.

With the delay monitor circuit 50 in FIG. 14, a delay row having appropriate f-V characteristics can be selected in accordance with the operating state of the controlled circuit 2. Thus, the degree of freedom in AVS control becomes higher. Further, in a case where the arithmetic processor 54 calculates a delay time by an arithmetic operation, the delay time to be fed back to the power supply voltage control circuit 20 can be generated on the basis of f-V characteristics different from the delay elements that has actually performed measurement. This further increases the degree of freedom in AVS control.

As described above, according to the fourth and fifth embodiments, the delay monitor circuit 50 is provided separately from the clock generation circuit 30, but can have the same configuration or the same f-V characteristics as the critical path, like the clock generation circuit 30. Accordingly, the fourth and fifth embodiments can achieve effects similar to those of the first embodiment. The fourth and fifth embodiments may be combined with the second or third embodiment. For example, in a case where the fourth or fifth embodiment is combined with the second embodiment, the power supply voltage $V_{DDOSC}$ to be supplied to the clock generation circuit 30 and/or the delay monitor circuit 50 may be the internal voltage selected by the multiplexer $MUX_{H1}$. Also, the low-voltage power supply to be supplied to the clock generation circuit 30 and/or the delay monitor circuit 50 may be the internal voltage selected by the multiplexer $MUX_{L1}$. In a case where the fourth or fifth embodiment is combined with the third embodiment, for example, a plurality of clock generation circuits 30 and/or a plurality of delay monitor circuits 50 are provided, and two multiplexers corresponding to the clock generation circuits 30 and the delay monitor circuits 50 are provided. One of the multiplexers outputs the clock signal CLK having the lowest frequency among the clock signals from the plurality of clock generation circuits 30, to the controlled circuit 2. The other one of the multiplexers is only required to feed back the longest delay time among the delay times obtained from the plurality of delay monitor circuits 50, to the power supply voltage control circuit 20.

As the delay monitor circuit 50 is provided separately from the clock generation circuit 30 as described above, it is possible to make the configurations of the clock generation circuit 30 and the delay monitor circuit 50 different from each other while making the f-V characteristics equal. This can increase the degree of freedom in the circuit design of the voltage control device 1.

(Configuration of the Clock Generation Circuit 30)

The internal configuration of the delay monitor circuit 50 according to the fourth and fifth embodiments is now described.

Figure 15:
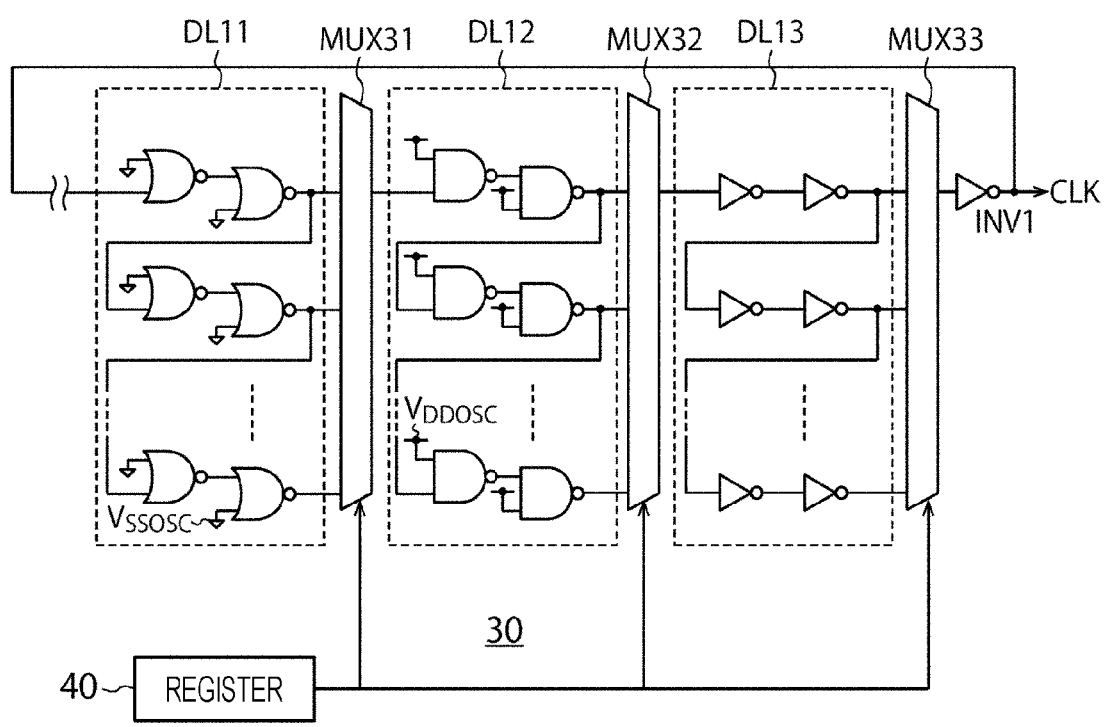
FIG. 15 is a circuit diagram showing an example configuration of a clock generation circuit.

FIG. 15 is a circuit diagram showing an example configuration of the clock generation circuit 30. The clock generation circuit 30 includes delay circuits DL11 to DL13, and multiplexers MUX31 to MUX33. The delay circuits DL11 to DL13 have different kinds of delay elements from one another. Each of the delay circuits DL11 to DL13 is formed with a plurality of identical delay elements connected in series. However, the configuration of each of the delay circuits DL11 to DL13 is not limited to this.

The delay circuits DL11 to DL13 are connected in series via the multiplexers MUX31 to MUX33. For example, the delay circuit DL11 outputs a plurality of output signals obtained from different delay elements, to the multiplexer MUX31. The multiplexer MUX31 selects one output signal from the plurality of output signals from the delay circuit DL11, and outputs the selected output signal to the delay circuit DL12 in the stage that follows.

Likewise, the delay circuit DL12 outputs a plurality of output signals obtained from different delay elements, to the multiplexer MUX32. The multiplexer MUX32 selects one output signal from the plurality of output signals from the delay circuit DL12, and outputs the selected output signal to the delay circuit DL13 in the stage that follows.

The delay circuit DL13 outputs a plurality of output signals obtained from a plurality of different portions of delay elements, to the multiplexer MUX33. The multiplexer MUX33 selects one output signal from the plurality of output signals from the delay circuit DL13, inverts the selected output signal with an inverter INV1, and outputs the inverted signal as the clock signal CLK.

The clock generation circuit 30 outputs the output signal from the inverter INV1 to the controlled circuit 2, and feeds back the output signal to its own input.

The multiplexers MUX31 to MUX33 select one of the output signals, on the basis of information from the register 40. With this arrangement, the clock generation circuit 30 can form a delay circuit having appropriate f-V characteristics in accordance with the operating state of the controlled circuit 2, and perform AVS control on the controlled circuit 2, using an appropriate power supply voltage $V_{DD}$.

(Modification of the Clock Generation Circuit 30)

Figure 16:
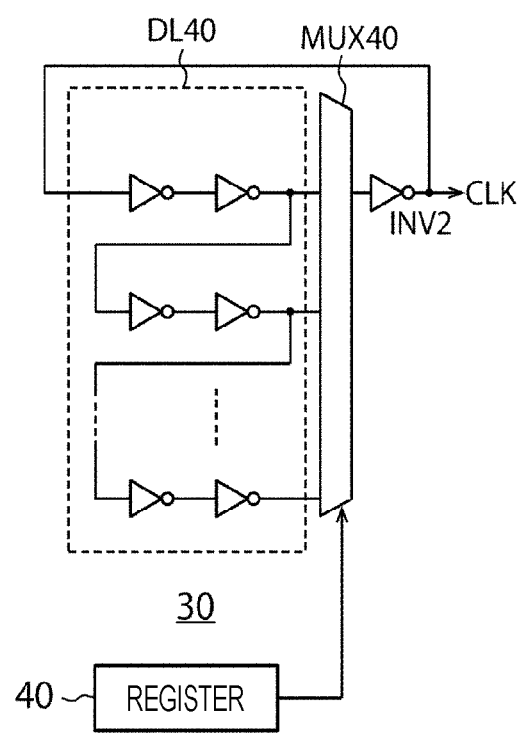
FIG. 16 is a circuit diagram showing another example configuration of a clock generation circuit.

FIG. 16 is a circuit diagram showing another example configuration of the clock generation circuit 30. The clock generation circuit 30 of this modification includes a delay circuit DL40 and a multiplexer MUX40. The delay circuit DL40 includes delay elements of one kind (inverter circuits, for example) connected in series, and is output via the multiplexer MUX40. For example, the delay circuit DL40 outputs a plurality of output signals obtained from a plurality of different portions of delay elements, to the multiplexer MUX40. The multiplexer MUX40 selects one output signal from the plurality of output signals from the delay circuit DL40, inverts the selected output signal with an inverter INV2, and outputs the inverted signal as the clock signal CLK. The multiplexer MUX40 selects one of the output signals, on the basis of information from the register 40.

As described above, even with the delay circuit DL40 including delay elements of only one kind, the clock generation circuit 30 can have any desired delay time by changing the number of delay elements connected in series. Information about the number of delay elements connected in series may be stored beforehand into the register 40.

With this arrangement, the clock generation circuit 30 according to this modification can also form a delay circuit having appropriate f-V characteristics in accordance with the operating state of the controlled circuit 2, and perform AVS control on the controlled circuit 2, using an appropriate power supply voltage $V_{DD}$.

The present technology can also have the configurations described below.

(1)

A voltage control device including:
a power supply circuit that supplies electric power to an input terminal of a controlled circuit;
a power supply voltage control circuit that controls a power supply voltage to be supplied from the power supply circuit to the controlled circuit, on the basis of a clock signal to be supplied to the controlled circuit; and
a clock generation circuit that receives a power supply that is an internal voltage to be applied to a second internal circuit region at a second wiring distance from the input unit, and generates the clock signal on the basis of the internal voltage, the second wiring distance being longer than a first wiring distance at which a first internal circuit region is located in the controlled circuit, the first wiring distance and the second wiring distance being wiring distances in the controlled circuit from the input unit.

(2)

The voltage control device according to claim 1, in which the second wiring distance is longer than half the longest distance among a plurality of wiring distances from the input unit to a plurality of internal circuit regions in the controlled circuit.

(3)

The voltage control device according to claim 1, in which the second wiring distance is substantially the longest among a plurality of wiring distances from the input unit to a plurality of internal circuit regions in the controlled circuit.

(4)

The voltage control device according to any one of claims 1 to 3, in which the internal voltage is lower than a voltage to be applied to the first internal circuit region.

(5)

The voltage control device according to any one of claims 1 to 4, in which the internal voltage has a voltage drop that is larger than half the largest voltage drop from the power supply voltage in the controlled circuit.

(6)

The voltage control device according to any one of claims 1 to 5, in which the internal voltage is substantially the lowest voltage among voltages to be supplied to a plurality of internal circuit regions in the controlled circuit.

(7) The voltage control device according to any one of claims 1 to 6, in which a linear distance from the input unit to the second internal circuit region is longer than a linear distance from the input unit to the first internal circuit region.

(8) The voltage control device according to any one of claims 1 to 7, in which a linear distance from the input unit to the second internal circuit region is longer than half the longest distance among a plurality of linear distances from the input unit to a plurality of internal circuit regions in the controlled circuit.

(9) The voltage control device according to claim 8, in which the linear distance from the input unit to the second internal circuit region is substantially the longest among the plurality of linear distances from the input unit to the plurality of internal circuit regions in the controlled circuit.

(10) The voltage control device according to any one of claims 1 to 9, in which the clock generation circuit has the same circuit configuration as the second internal circuit region.

(11) The voltage control device according to any one of claims 1 to 10, in which the clock generation circuit includes a delay circuit that inverts an input signal, outputs the inverted input signal as an output signal, and receives an input of the output signal as the input signal.

(12) The voltage control device according to any one of claims 1 to 11, further including
a selection circuit that receives an input of a plurality of internal voltages to be applied to a plurality of internal circuit regions in the controlled circuit, and selects the lowest internal voltage from the plurality of internal voltages,
in which the clock generation circuit receives the lowest internal voltage as the power supply, and generates the clock signal on the basis of the lowest internal voltage.

(13) The voltage control device according to claim 12, further including
a storage unit that stores information about the second internal circuit region that receives the lowest internal voltage,
in which the selection circuit selects the second internal circuit region on the basis of the information obtained from the storage unit.

(14) The voltage control device according to any one of claims 1 to 11, further including:
a plurality of clock generation circuits that receives power supplies that are a plurality of internal voltages to be applied to a plurality of internal circuit regions in the controlled circuit, and generates a plurality of clock signals on the basis of the plurality of internal voltages; and
a selection circuit that receives an input of a plurality of clock signals from the plurality of clock generation circuits, and selects a clock signal having the lowest frequency from the plurality of clock signals.

(15) The voltage control device according to claim 14, further including
a storage unit that stores information about the clock generation circuit that outputs the clock signal having the lowest frequency,
in which the selection circuit selects the clock signal on the basis of the information obtained from the storage unit.

Note that the present disclosure is not limited to the embodiments described above, and various modifications may be made to them without departing from the scope of the present disclosure. Furthermore, the advantageous effects described in this specification are merely examples, and the advantageous effects of the technology are not limited to them and may include other effects.

REFERENCE SIGNS LIST

1 Voltage control device
10 Power supply circuit
20 Power supply voltage control circuit
30 Clock generation circuit
IC01 to ICnn Internal circuit regions IC01 to ICnn
$MUX_{H1}$, $MUX_{L1}$, and MUX2 Multiplexer

The invention claimed is:
1. A voltage control device, comprising:
a power supply circuit configured to supply electric power to an input terminal of a controlled circuit;
a power supply voltage control circuit configured to control a power supply voltage to be supplied from the power supply circuit to the controlled circuit, based on a clock signal to be supplied to the controlled circuit; and
a clock generation circuit configured to:
receive a power supply that is an internal voltage to be applied to a second internal circuit region at a second wiring distance from the input terminal, and
generate the clock signal based on the internal voltage, wherein
the second wiring distance is longer than a first wiring distance at which a first internal circuit region is located in the controlled circuit, and
the first wiring distance and the second wiring distance corresponds to wiring distances in the controlled circuit from the input terminal.

2. The voltage control device according to claim 1, wherein the second wiring distance is longer than half of a longest wiring distance among a plurality of wiring distances from the input terminal to a plurality of internal circuit regions in the controlled circuit.

3. The voltage control device according to claim 1, wherein the second wiring distance is substantially a longest wiring distance among a plurality of wiring distances from the input terminal to a plurality of internal circuit regions in the controlled circuit.

4. The voltage control device according to claim 1, wherein the internal voltage is lower than the power supply voltage to be applied to the first internal circuit region.

5. The voltage control device according to claim 1, wherein the internal voltage has a voltage drop that is larger than half of a largest voltage drop from the power supply voltage in the controlled circuit.

6. The voltage control device according to claim 1, wherein the internal voltage is substantially a lowest voltage among a plurality of internal voltages to be supplied to a plurality of internal circuit regions in the controlled circuit.

7. The voltage control device according to claim 1, wherein a linear distance from the input terminal to the second internal circuit region is longer than a linear distance from the input terminal to the first internal circuit region.

8. The voltage control device according to claim 1, wherein a linear distance from the input terminal to the second internal circuit region is longer than half of a longest distance among a plurality of linear distances from the input terminal to a plurality of internal circuit regions in the controlled circuit.

9. The voltage control device according to claim 8, wherein the linear distance from the input terminal to the second internal circuit region is substantially a longest linear distance among the plurality of linear distances from the input terminal to the plurality of internal circuit regions in the controlled circuit.

10. The voltage control device according to claim 1, wherein the clock generation circuit has a circuit configuration same as that of the second internal circuit region.

11. The voltage control device according to claim 1, wherein the clock generation circuit includes a delay circuit configured to:
    invert an input signal,
    output the inverted input signal as an output signal; and
    receive an input of the output signal as the input signal.

12. The voltage control device according to claim 1, further comprising
    a selection circuit configured to:
        receive an input of a plurality of internal voltages to be applied to a plurality of internal circuit regions in the controlled circuit, and
        select a lowest internal voltage from the plurality of internal voltages, wherein the clock generation circuit is configured to:
            receive the lowest internal voltage as the power supply, and
            generate the clock signal based on the lowest internal voltage.

13. The voltage control device according to claim 12, further comprising
    a storage unit configured to store information about the second internal circuit region that receives the lowest internal voltage,
        wherein the selection circuit is configured to select the second internal circuit region based on the information obtained from the storage unit.

14. The voltage control device according to claim 1, further comprising:
    a plurality of clock generation circuits configured to:
        receive power supplies that are a plurality of internal voltages to be applied to a plurality of internal circuit regions in the controlled circuit, and
        generate a plurality of clock signals based on the plurality of internal voltages; and
    a selection circuit configured to:
        receive an input of a plurality of clock signals from the plurality of clock generation circuits, and
        select a clock signal having a lowest frequency from the plurality of clock signals.

15. The voltage control device according to claim 14, further comprising
    a storage unit configured to store information about the clock generation circuit that outputs the clock signal having the lowest frequency,
        wherein the selection circuit is configured to select the clock signal based on the information obtained from the storage unit.

* * * * *